United States Patent
Doi et al.

(12)

(10) Patent No.: US 6,368,907 B1
(45) Date of Patent: Apr. 9, 2002

(54) METHOD OF FABRICATING SEMICONDUCTOR DEVICE

(75) Inventors: Hiroyuki Doi; Takao Yamaguchi, both of Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/661,369

(22) Filed: Sep. 13, 2000

(30) Foreign Application Priority Data

Nov. 29, 1999 (JP) .......................................... 11-337069

(51) Int. Cl.⁷ ........................................ H01L 21/8238
(52) U.S. Cl. ...................... 438/217; 438/257; 438/303
(58) Field of Search ................................. 438/275, 276, 438/277, 287, 257, 258, 266, 268; 257/316, 321, 322

(56) References Cited

U.S. PATENT DOCUMENTS 5,933,721 A * 8/1999 Hause et al. ................. 438/217

FOREIGN PATENT DOCUMENTS

| JP | 2-288363 | 11/1990 |
|----|----------|---------|
| JP | 10-261773 | 9/1998 |
| JP | 11-103032 | 4/1999 |

* cited by examiner

Primary Examiner—David Nelms
Assistant Examiner—Dung Anh Le
(74) Attorney, Agent, or Firm—Eric J. Robinson; Nixon Peabody LLP

(57) ABSTRACT

After forming a control gate electrode, an interelectrode insulating film and a floating gate electrode of a nonvolatile memory device in a memory region with allowing a conducting film to remain in a logic region, an insulating film for implant protection is formed on a substrate, and ion implantation is carried out to form a source/drain diffusion layer of the nonvolatile memory device. Then, after removing the insulating film for implant protection, the conducting film is patterned into a gate electrode of a logic device. Thereafter, impurity ion implantation is carried out with the gate electrode used as a mask so as to form an LDD diffusion layer of the logic device. At this point, since the insulating film for implant protection has already been removed from the logic region, a shallow PN junction can be formed, resulting in realizing a logic device suitable to refinement.

8 Claims, 16 Drawing Sheets

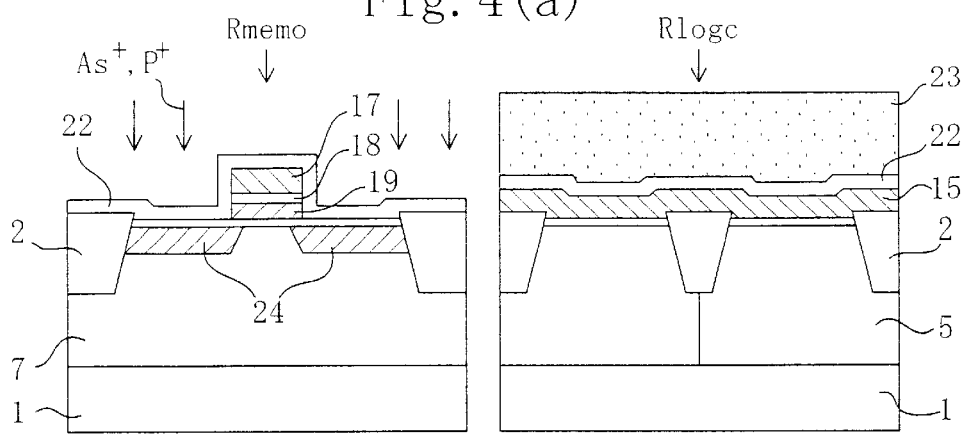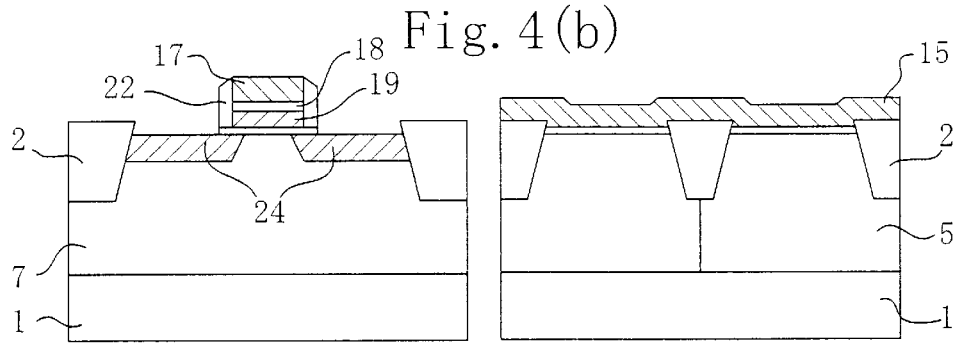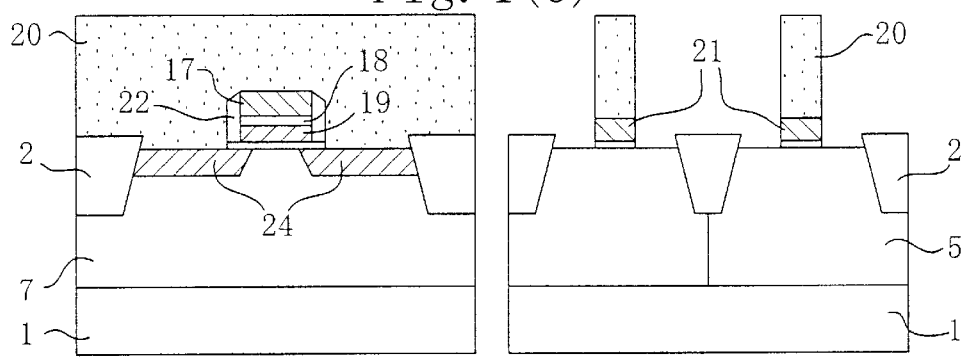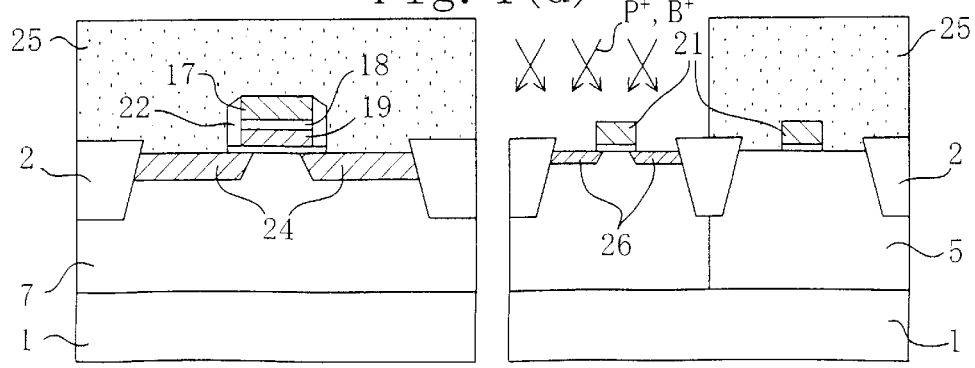

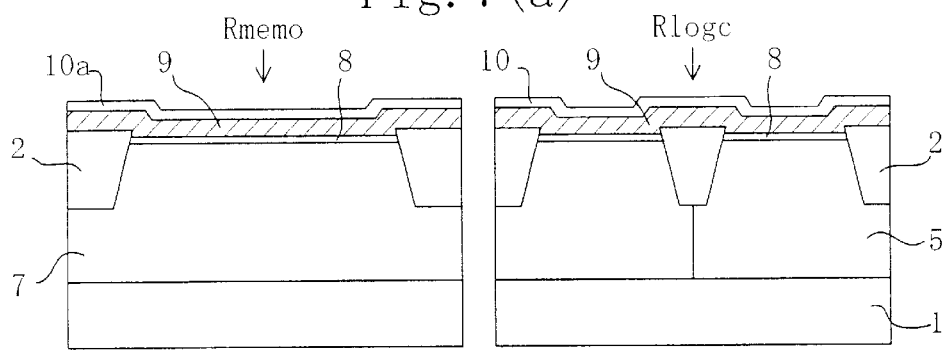
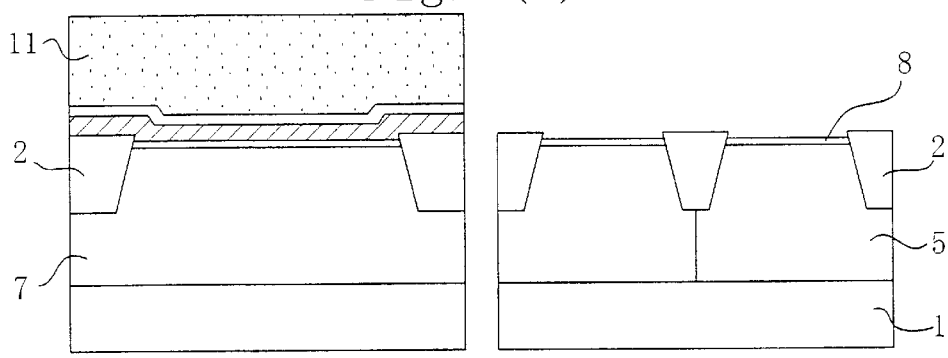
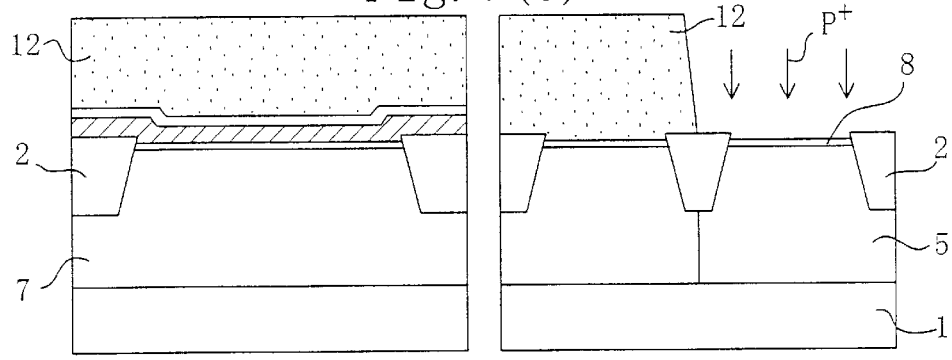
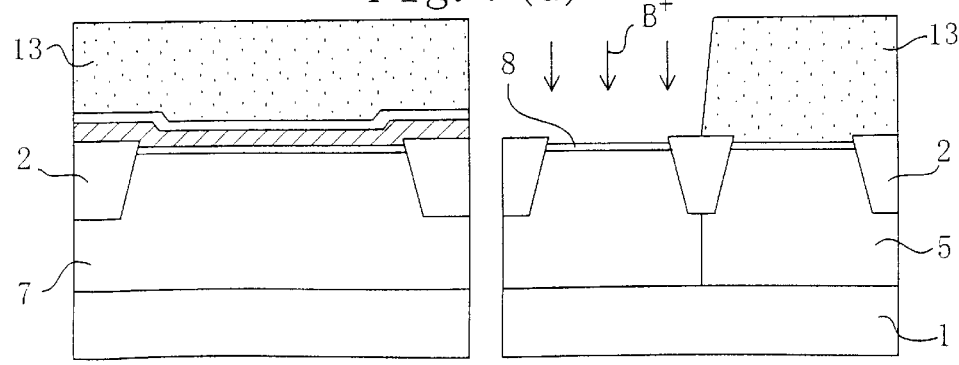

METHOD OF FABRICATING SEMICONDUCTOR DEVICE

BACKGROUND OF THE INVENTION

The present invention relates to a method of fabricating a semiconductor device containing a nonvolatile memory device and a logic device.

In fabrication of a semiconductor device containing both a nonvolatile memory device (PROM memory cells) and a logic device (CMOS transistors), a method in which improvement in reliability of the nonvolatile memory device and high performance of the logic device can be both realized is recently desired.

A conventional method of fabricating such a semiconductor device containing both of these devices will now be described with reference to drawings.

FIGS. 12(a) through 12(d), 13(a) through 13(d), 14(a) through 14(d), 15(a) through 15(d) and 16(a) through 16(c) are sectional views for showing procedures in the conventional method of fabricating a semiconductor device. In each of these drawings, Rmemo indicates a memory region where a nonvolatile memory device is to be formed, Rlogc indicates a logic region where a logic device (including P-channel and N-channel transistors) is to be formed, a reference numeral 101 denotes a silicon substrate of P-type monosilicon, a reference numeral 102 denotes an isolation insulating film of a silicon oxide film, a reference numeral 103 denotes a first implant protection film of a silicon oxide film, a reference numeral 105 denotes an N-type well, a reference numeral 107 denotes a p-type well, a reference numeral 108 denotes a gate insulating film of the nonvolatile memory device, a reference numeral 109 denotes a first polysilicon film, a reference numeral 110 denotes an ONO film (a laminated film including an oxide film, a nitride film and an oxide film), a reference numeral 114 denotes a gate insulating film of the logic device, a reference numeral 115 denotes a second polysilicon film, a reference numeral 117 denotes a control gate electrode of the nonvolatile memory device, a reference numeral 118 denotes an interelectrode insulating film of the nonvolatile memory device, a reference numeral 119 denotes a floating gate electrode of the nonvolatile memory device, a reference numeral 121 denotes a gate electrode of the logic device, a reference numeral 122 denotes a second implant protection film, a reference numeral 124 denotes a source/drain diffusion layer of the nonvolatile memory device, a reference numeral 126 denotes an LDD diffusion layer of the N-channel transistor, a reference numeral 128 denotes an LDD diffusion layer of the P-channel transistor, a reference numeral 129 denotes a sidewall spacer of the nonvolatile memory device and the logic device, a reference numeral 131 denotes a source/drain diffusion layer of the N-channel transistor, a reference numeral 133 denotes a source/drain diffusion layer of the P-channel transistor, and reference numerals 104, 106, 111, 112, 113, 116, 120, 123, 125, 127, 130 and 132 denote masks of photoresist films for use in ion implantation or etching.

First, in the procedure shown in FIG. 12(a), an isolation insulating film 102 of a silicon oxide film is formed in the memory region Rmemo and the logic region Rlogc on a silicon substrate 101, and a first implant protection film 103 of a silicon oxide film is then formed in a region surrounded with the isolation insulating film 102 on the silicon substrate 101.

Next, in the procedure shown in FIG. 12(b), an N-type well 105 is formed in the silicon substrate 101 by implanting ions of an N-type impurity (such as phosphorus) into a P-channel transistor formation region of the logic region Rlogc by using an N-type well formation mask 104 for covering the memory region Rmemo and an N-channel transistor formation region of the logic region Rlogc.

Then, in the procedure shown in FIG. 12(c), after removing the N-type well formation mask 104, a P-type well 107 is formed in the silicon substrate 101 by implanting ions of a P-type impurity (such as boron) into the entire memory region Rmemo and the N-channel transistor formation region of the logic region Rlogc by using a P-type well formation mask 106 for covering the P-channel transistor formation region of the logic region Rlogc. At the same time, impurity ions are implanted into the silicon substrate 101 by using the P-type well formation mask 106 for controlling the threshold values of the nonvolatile memory device and the N-channel transistor.

Next, in the procedure shown in FIG. 12(d), after removing the P-type well formation mask 106, the first implant protection film 103 in both the memory region Rmemo and the logic region Rlogc is removed by wet etching using buffered hydrofluoric acid.

Subsequently, in the procedure shown in FIG. 13(a), a gate insulating film 108 of a silicon oxide film of the nonvolatile memory device is formed in the memory region Rmemo and the logic region Rlogc by thermal oxidation, and a first polysilicon film 109 including phosphorus is then formed by CVD. The first polysilicon film 109 is to be formed into a floating gate electrode of the nonvolatile memory device. Thereafter, the first polysilicon film 109 is patterned by using a mask not shown so as to determine the dimension along the channel width of the nonvolatile memory device. Then, after removing the mask for patterning the first polysilicon film 109, an ON film 110a (a laminated film including an oxide film and a nitride film) to be formed into an interelectrode insulating film of the nonvolatile memory device is formed by the CVD.

Next, in the procedure shown in FIG. 13(b), the ON film 110a and the first polysilicon film 109 in the logic region Rlogc are successively removed by the dry etching using a mask 111 for covering the entire memory region Rmemo.

Then, in the procedure shown in FIG. 13(c), phosphorus ions ($P^+$) are implanted for controlling the threshold value of the P-channel transistor in the logic region Rlogc by using a threshold controlling implantation mask 112 for covering the entire memory region Rmemo and the N-channel transistor formation region of the logic region Rlogc with the gate insulating film 108 remaining after the dry etching used as an implant protection film.

Next, in the procedure shown in FIG. 13(d), after removing the threshold control implantation mask 112, boron ions ($B^+$) are implanted for controlling the threshold value of the N-channel transistor in the logic region Rlogc by using a threshold controlling implantation mask 113 for covering the memory region Rmemo and the P-channel transistor formation region of the logic region Rlogc with the gate insulating film 108 used as an implant protection film.

Then, in the procedure shown in FIG. 14(a), after removing the threshold controlling implantation mask 113, the gate insulating film 108 remaining in the logic region Rlogc is removed by the wet etching using buffered hydrofluoric acid.

Next, in the procedure shown in FIG. 14(b), a gate insulating film 114 of a silicon oxide film of the logic device is formed by the thermal oxidation. At this point, the surface of the ON film 110a in the memory region Rmemo is also oxidized into an ONO film 110. Then, a second polysilicon film 15 including phosphorus to be formed into a control gate electrode of the nonvolatile memory device and a gate electrode of the logic device is formed by the CVD.

Then, in the procedure shown in FIG. 14(c), the second polysilicon film 115, the first insulating film 110 and the first polysilicon film 109 in the memory region Rmemo are successively patterned by the dry etching using a stacked gate formation mask 116 for covering the entire logic region Rlogc and a gate formation region of the memory region Rmemo, so as to form a stacked gate of the nonvolatile memory device including a control gate electrode 117, an interelectrode insulating film 118 and a floating gate electrode 119.

Next, in the procedure shown in FIG. 14(d), after removing the stacked gate formation mask 116, the second polysilicon film 115 in the logic region Rlogc is patterned by the dry etching using a gate electrode formation mask 120 for covering the entire memory region Rmemo and a gate formation region of the logic region Rlogc, thereby forming a gate electrode 121 of the logic device.

Then, in the procedure shown in FIG. 15(a), after removing the gate electrode formation mask 120, the surfaces of the silicon layers (monosilicon and polysilicon layers) exposed on the silicon substrate 101 are oxidized by the thermal oxidation, thereby forming a second implant protection film 122 of a silicon oxide film covering the silicon substrate 101, the stacked gate of the nonvolatile memory device and the gate electrode 121 of the logic device. The second implant protection film 122 is also used as a protection film in ion implantation for forming a source/drain diffusion layer of the nonvolatile memory device.

Then, in the procedure shown in FIG. 15(b), a source/drain diffusion layer 124 of the nonvolatile memory device is formed by implanting, for example, arsenic ions ($As^+$) and phosphorus ions ($P^+$) by using a source/drain formation mask 123 for covering the entire logic region Rlogc.

Subsequently, in the procedure shown in FIG. 15(c), after removing the source/drain formation mask 123, the substrate is subjected to a heat treatment in an atmosphere of oxygen for recovering damage caused by the ion implantation. Thereafter, an LDD diffusion layer 126 of the N-channel transistor in the logic region Rlogc is formed by implanting phosphorus ions ($P^+$) by using an LDD implantation mask 125 for covering the entire memory region Rmemo and the P-channel transistor formation region of the logic region Rlogc. This ion implantation is carried out in four steps at an ion acceleration voltage of approximately 50 keV, a dose of approximately $1 \times 10^{13}$ $cm^{-2}$ and an ion implantation angle inclined from the normal of the substrate by approximately 25 degrees. Furthermore, for suppressing punch-through, boron ions ($B^+$) are implanted by using the LDD implantation mask 125 in four steps at an ion acceleration voltage of approximately 50 keV, a dose of approximately $3 \times 10^2$ $cm^{-2}$ and an ion implantation angle inclined by approximately 25 degrees.

Next, in the procedure shown in FIG. 15(d), after removing the LDD implantation mask 125, boron fluoride ions ($BF_2^+$) are implanted by using an LDD implantation mask 127 for covering the entire memory region Rmemo and the N-channel transistor formation region of the logic region Rlogc, thereby forming an LDD diffusion layer 128 of the P-channel transistor in the logic region Rlogc. This ion implantation is carried out in four steps at an ion acceleration voltage of approximately 50 keV, a dose of approximately $1 \times 10^{13}$ $cm^{-2}$ and an ion implantation angle inclined from the normal of the substrate by approximately 7 degrees.

Then, in the procedure shown in FIG. 16(a), after removing the LDD implantation mask 127, a TEOS film is deposited on the substrate, and formed into sidewall spacers 129 on the side faces of the stacked gate of the nonvolatile memory device and the gate electrode of the logic device by anisotropic dry etching.

Next, in the procedure shown in FIG. 16(b), arsenic ions or the like are implanted by using a source/drain implantation mask 130 for covering the entire memory region Rmemo and the P-channel transistor formation region of the logic region Rlogc, thereby forming a source/drain diffusion layer 131 of the N-channel transistor in the logic region Rlogc.

Then, in the procedure shown in FIG. 16(c), after removing the source/drain implantation mask 130, boron fluoride ions or the like are implanted by using a source/drain implantation mask 132 for covering the entire memory region Rmemo and the N-channel transistor formation region of the logic region Rlogc, thereby forming a source/drain diffusion layer 133 of the P-channel transistor in the logic region Rlogc.

As described above, with the floating gate electrode 119 of the nonvolatile memory device covered with the second implant protection film 122, the ion implantation for forming the source/drain diffusion layer 124 of the nonvolatile memory device is carried out. Therefore, the impurity ions such as arsenic and phosphorus are suppressed from punching through the floating gate electrode at the lower edge thereof to the gate insulating film below. Accordingly, the insulating property of the gate insulating film 108 of the nonvolatile memory device can be suppressed from degrading.

Furthermore, although the second implant protection film 122 cannot completely suppress the punch-through of the impurity ions, since the heat treatment is carried out in an atmosphere of oxygen after the impurity ion implantation, the gate insulating film 108 of the nonvolatile memory device, which is degraded in the insulating property by the damage caused in the impurity ion implantation, can be oxidized again so as to recover its insulating property. Accordingly, the nonvolatile memory device can be provided with a gate insulating film with high reliability.

The conventional method of fabricating a semiconductor device containing both a nonvolatile memory device and a logic device, however, has the following problems:

First, in the procedures shown in FIGS. 15(c) and 15(d), the second implant protection film 122 serving as the implant protection film for forming the source/drain diffusion layer of the nonvolatile memory device is formed so as to cover the entire substrate in the ion implantation for forming the LDD diffusion layer of the logic device. Therefore, the ion acceleration voltage inevitably has a large value (of approximately 50 keV). As a result, a shallow PN junction cannot be formed between the LDD diffusion layer and the P-type well, which makes it difficult to meet the demand for refinement of the device.

Secondly, in the procedure shown in FIG. 15(a), in the formation of the second implant protection film 122 serving as the implant protection film for forming the source/drain diffusion layer of the nonvolatile memory device by the thermal oxidation, oxygen enters both end portions of the gate insulating film 114 of the logic device to form an oxide film therein, which causes the so-called gate bird's beak. As a result, variation in the channel length of the logic device is increased, so as to greatly vary the short channel effect and the transistor characteristic, namely, to lower the reliability.

Thirdly, in order to attain high performance (rapid operation) of a P-channel transistor, it is preferred to dope the gate electrode of an N-channel transistor with phosphorus and the gate electrode of the P-channel transistor with boron (namely, to employ a dual gate structure). In the procedure shown in FIG. 15(a), however, when the entire substrate is kept at a comparatively high temperature for the thermal oxidation, boron doped in the gate electrode of the P-channel transistor can be diffused into the semiconductor substrate, so as to cause variation in the threshold value. Accordingly, the gate electrodes of both the P-channel transistor and the N-channel transistor are inevitably doped with an N-type impurity as in the aforementioned conventional method, and it is thus very difficult to adopt the dual gate structure in the logic device.

SUMMARY OF THE INVENTION

An object of the invention is providing a method of fabricating a semiconductor device in which high reliability of a nonvolatile memory device and refinement of a logic device can be both realized.

Another object of the invention is providing a method of fabricating a semiconductor device in which a logic device can be easily formed in the dual gate structure.

The first method of this invention of fabricating a semiconductor device including, on a semiconductor substrate, a memory region where a nonvolatile memory device is disposed and a logic region where a logic device is disposed, comprises the steps of (a) forming, in the memory region, a first insulating film to be formed into a gate insulating film of the nonvolatile memory device, a first conducting film and a second insulating film and forming, in the logic region, a gate insulating film of the logic device; (b) forming a second conducting film on the semiconductor substrate after the step (a); (c) forming a stacked gate of the nonvolatile memory device including a control gate electrode, an interelectrode insulating film and a floating gate electrode of the nonvolatile memory device by patterning the second conducting film, the second insulating film and the first conducting film in the memory region with allowing the second conducting film to remain in the logic region; (d) forming, on the semiconductor substrate, a third insulating film for implant protection of the stacked gate after the step (c); (e) implanting impurity ions for forming source/drain diffusion layers of the nonvolatile memory device into regions on both sides of the floating gate electrode in the semiconductor substrate after the step (d); (f) removing at least a portion of the third insulating film disposed on the second conducting film by subjecting the third insulating film to anisotropic etching after the step (e); and (g) forming a gate electrode of the logic device by patterning the second conducting film remaining in the logic region.

According to this method, since the third insulating film for implant protection is not present in the logic region in forming a diffusion layer such as an LDD diffusion layer of the logic device after the step (g), the diffusion layer of the logic device can be provided with a shallow PN junction. Accordingly, the logic device can attain refinement. On the other hand, in forming the source/drain diffusion layer of the nonvolatile memory device, the side faces of the floating gate electrode of the nonvolatile memory device is covered with the third insulating film for implant protection. Therefore, it is possible to suppress the degradation in the insulating property of the gate insulating film derived from the impurity punching through the lower edge of the floating gate electrode to the gate insulating film of the nonvolatile memory device. As a result, not only the performance of the nonvolatile memory can be retained but also the logic device can be refined.

When the method further comprises, between the step (e) and the step (f), a step of subjecting the semiconductor substrate to a heat treatment in an oxidizing atmosphere, damage of the end portions of the gate insulating film of the nonvolatile memory device derived from the impurity ion implantation can be recovered, so that the nonvolatile memory device can attain higher performance.

When the method further comprises the steps of implanting impurity ions for forming an LDD diffusion layer of the logic device by using the gate electrode as a mask after the step (g); forming sidewall spacers on side faces of the floating gate electrode, the interelectrode insulating film and the control gate electrode of the nonvolatile memory device and side faces of the gate electrode of the logic device after forming the LDD diffusion layer of the logic device; and implanting impurity ions for forming source/drain diffusion layers of the logic device into the logic region by using the gate electrode and the sidewall spacers used as a mask, the logic device of the semiconductor device can be formed in an LDD structure suitable to refinement.

The second method of this invention of fabricating a semiconductor device including, on a semiconductor substrate, a memory region where a nonvolatile memory device is disposed and a logic region where a logic device is disposed, comprises the steps of (a) forming, in the memory region, a first insulating film to be formed into a gate insulating film of the nonvolatile memory device, a conducting film and a second insulating film and forming, in the logic region, a gate insulating film of the logic device; (b) forming a polysilicon film on the semiconductor substrate after the step (a); (c) implanting N-type impurity ions into portions of the polysilicon film disposed in the memory region and an N-channel logic element formation region of the logic region; (d) forming a stacked gate of the nonvolatile memory device including a control gate electrode, an interelectrode insulating film and a floating gate electrode by patterning the polysilicon film, the second insulating film and the conducting film in the memory region with allowing the polysilicon film to remain in the logic region; (e) forming, on the semiconductor substrate, a third insulating film for implant protection of the stacked gate after the step (d); (f) implanting impurity ions for forming source/drain diffusion layer of the nonvolatile memory device into regions on both sides of the floating gate electrode in the semiconductor substrate after the step (e); (g) removing at least a portion of the third insulating film disposed on the polysilicon film by subjecting the third insulating film to anisotropic etching after the step (f); (h) implanting P-type impurity ions into a portion of the polysilicon film disposed in a P-channel logic element formation region of the logic region after the step (f) or before or after the step (g); and (i) forming a gate electrode of the logic device by patterning the polysilicon film remaining in the logic region.

According to this method, in addition to the effects attained by the first method of fabricating a semiconductor device, the logic device can be formed from a transistor having a higher operation speed owing to the dual gate structure.

When the method further comprises, after the step (f) or before the step (h), a step of subjecting the semiconductor substrate to a heat treatment in an oxidizing atmosphere, damage of the end portions of the gate insulating film of the nonvolatile memory device derived from the impurity ion implantation can be recovered, so that the nonvolatile memory device can attain higher performance.

When the method further comprises the steps of implanting impurity ions for individually forming LDD diffusion layers of a P-channel logic element and an N-channel logic element of the logic device by using the gate electrode as a mask after the step (i); forming sidewall spacers on side faces of the floating gate electrode, the interelectrode insulating film and the control gate electrode of the nonvolatile memory device and side faces of the gate electrode of the logic device after forming the LDD diffusion layers; and implanting impurity ions for individually forming source/drain diffusion layers of the P-channel logic element and the N-channel logic element in the logic region by using the gate electrode and the sidewall spacers as a mask, the logic device of the semiconductor device can be formed in an LDD structure suitable to refinement.

In any of the first and second methods of fabricating a semiconductor device, the third insulating film for implant protection is preferably a silicon oxide film formed by CVD.

BRIEF DESCRIPTION OF THE DRAWINGS

FIGS. 4(a), 4(b), 4(c) and 4(d) are cross-sectional views for showing procedures up to formation of an LDD diffusion layer of an N-channel transistor in the method of fabricating a semiconductor device of Embodiment 1;

FIGS. 7(a), 7(b), 7(c) and 7(d) are cross-sectional views for showing procedures up to ion implantation for controlling the threshold value of each transistor in a logic region in the method of fabricating a semiconductor device of Embodiment 2;

DETAILED DESCRIPTION OF THE INVENTION

Embodiment 1

Figure 1A:
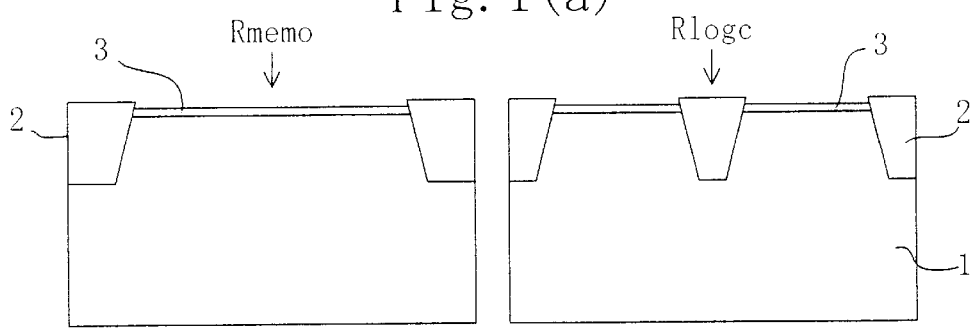
FIGS 1(a), 1(b), 1(c) and 1(d) are cross-sectional views for showing procedures up to formation of a well in a method of fabricating a semiconductor device of Embodiment 1 of the invention.

FIGS 1(a) through 1(d), 2(a) through 2(d), 3(a) through 3(d), 4(a) through 4(d) and 5(a) through 5(d) are sectional views for showing procedures in a method of fabricating a semiconductor device according to Embodiment 1 of the invention. In each of these drawings, Rmemo indicates a memory region where a nonvolatile memory device is to be formed, Rlogc indicates a logic region where a logic device (including P-channel and N-channel transistors) is to be formed, a reference numeral 1 denotes a semiconductor substrate of P-type monosilicon, a reference numeral 2 denotes an isolation insulating film of a silicon oxide film, a reference numeral 3 denotes a first implant protection film of a silicon oxide film, a reference numeral 5 denotes an N-type well, a reference numeral 7 denotes a P-type well, a reference numeral 8 denotes a gate insulating film of the nonvolatile memory device, a reference numeral 9 denotes a first polysilicon film, a reference numeral 10 denotes an ONO film (a laminated film including an oxide film, a nitride film and an oxide film), a reference numeral 14 denotes a gate insulating film of the logic device, a reference numeral 15 denotes a second polysilicon film, a reference numeral 17 denotes a control gate electrode of the nonvolatile memory device, a reference numeral 18 denotes an interelectrode insulating film of the nonvolatile memory device, a reference numeral 19 denotes a floating gate electrode of the nonvolatile memory device, a reference numeral 21 denotes a gate electrode of the logic device, a reference numeral 22 denotes a second implant protection film, a reference numeral 24 denotes a source/drain diffusion layer of the nonvolatile memory device, a reference numeral 26 denotes an LDD diffusion layer of the N-channel transistor of the logic device, a reference numeral 28 denotes an LDD diffusion layer of the P-channel transistor, a reference numeral 29 denotes a sidewall spacer of the nonvolatile memory device and the logic device, a reference numeral 31 denotes a source/drain diffusion layer of the N-channel transistor, a reference numeral 33 denotes a source/drain diffusion layer of the P-channel transistor, and reference numerals 4, 6, 11, 12, 13, 16, 20, 23, 25, 27, 30 and 32 denote masks of photoresist films for use in ion implantation or etching.

First, in the procedure shown in FIG. 1(a), an isolation insulating film 2 of a silicon oxide film is formed in the memory region Rmemo and the logic region Rlogc on a silicon substrate 1 of P-type monosilicon, and then, a first implant protection film 3 of a silicon oxide film is formed in a region surrounded with the isolation insulating film 2 on the silicon substrate 1.

Figure 1B:
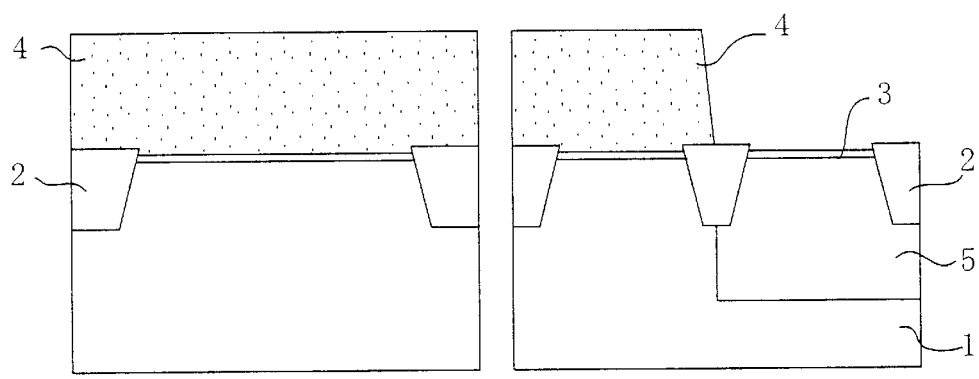

Next, in the procedure shown in FIG. 1(b), an N-type well 5 is formed by implanting ions of an N-type impurity (such as phosphorus) into a P-channel transistor formation region of the logic region Rlogc by using an N-type well formation mask 4 for covering the entire memory region Rmemo and an N-channel transistor formation region of the logic region Rlogc.

Figure 1C:
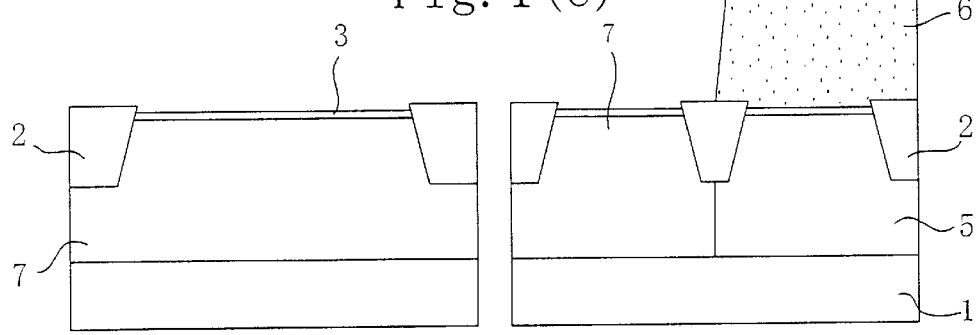

Then, in the procedure shown in FIG. 1(c), after removing the N-type well formation mask 4, a P-type well 7 is formed by implanting ions of a P-type impurity (such as boron) into the entire memory region Rmemo and the N-channel transistor formation region of the logic region Rlogc by using a P-type well formation mask 6 for covering the P-channel transistor formation region of the logic region Rlogc. At the same time, impurity ions are implanted into the silicon substrate 1 by using the P-type well formation mask 6 for controlling the threshold values of the nonvolatile memory device and the N-channel transistor.

Figure 1D:
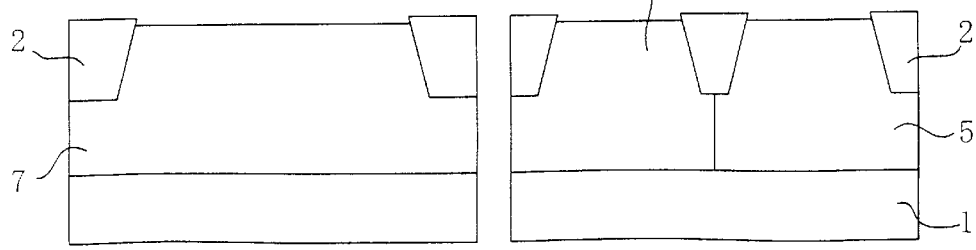

Next, in the procedure shown in FIG. 1(d), after removing the P-type well formation mask 6, the first implant protection film 3 in the memory region Rmemo and the logic region Rlogc is removed by wet etching using buffered hydrofluoric acid.

Figure 2A:
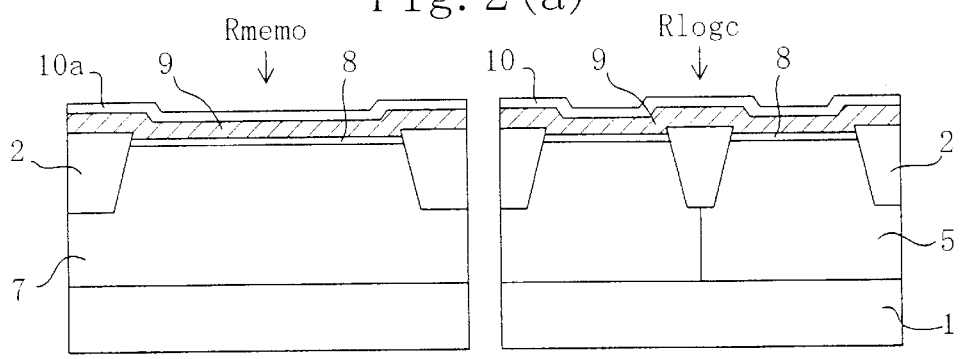
FIGS. 2(a), 2(b), 2(c) and 2(d) are cross-sectional views for showing procedures up to ion implantation for controlling the threshold value of each transistor in a logic region in the method of fabricating a semiconductor device of Embodiment 1.

Subsequently, in the procedure shown in FIG. 2(a), a gate insulating film 8 of a silicon oxide film is formed in the memory region Rmemo and the logic region Rlogc by thermal oxidation, and a first polysilicon film 9 of a polysilicon film including phosphorus is then formed by CVD. The first polysilicon film 9 is to be formed into a floating gate electrode of the nonvolatile memory device and has a thickness of approximately 200 nm. Thereafter, the first polysilicon film 9 is patterned by using a mask not shown so as to determine the dimension along the channel width of the nonvolatile memory device. After removing the mask for patterning the first polysilicon film 9, an ON film 10a (a laminated film including an oxide film and a nitride film) to be formed into an interelectrode insulating film of the nonvolatile memory device is formed by the CVD.

Figure 2B:
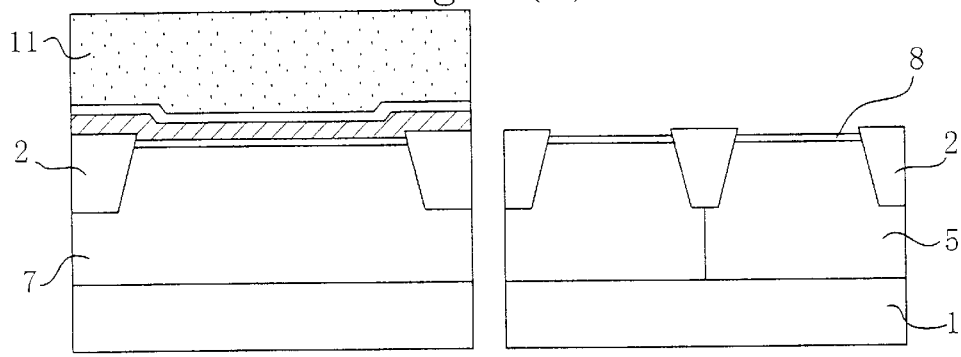

Next, in the procedure shown in FIG. 2(b), the ON film 10a and the first polysilicon film 9 in the logic region Rlogc are successively removed by the dry etching using a mask 11 for covering the entire memory region Rmemo.

Figure 2C:
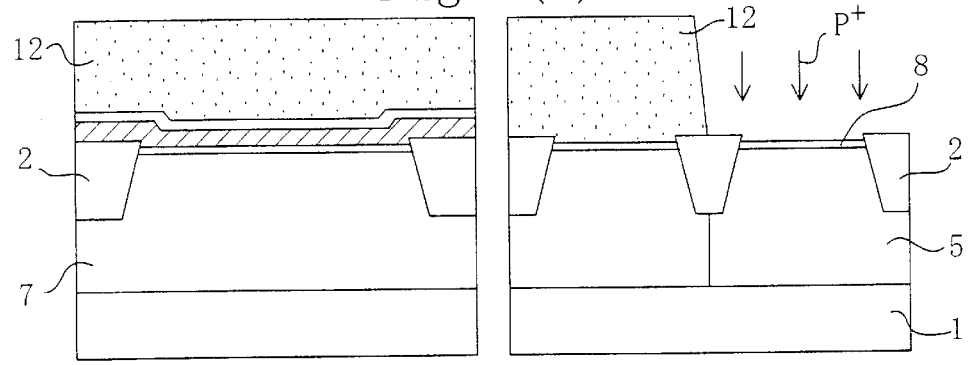

Then, in the procedure shown in FIG. 2(c), phosphorus ions ($P^+$) or the like are implanted for controlling the threshold value of the P-channel transistor of the logic region Rlogc by using a threshold controlling implantation mask 12 for covering the entire memory region Rmemo and the N-channel transistor formation region of the logic region Rlogc with the gate insulating film 8 remaining after the dry etching used as an implant protection film.

Figure 2D:
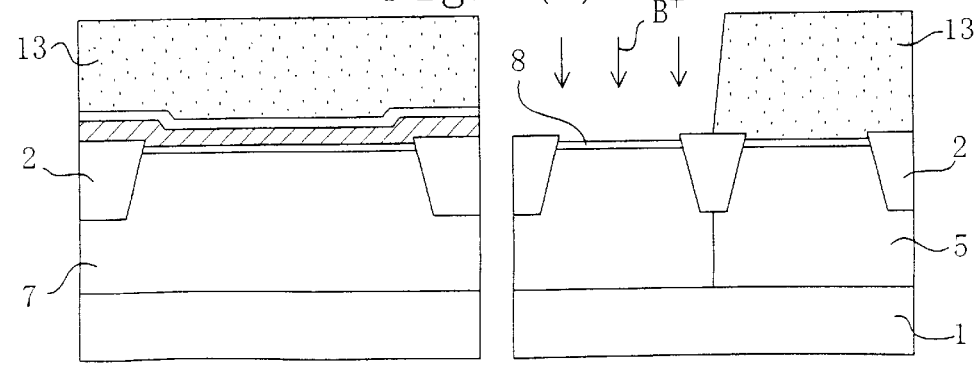

Next, in the procedure shown in FIG. 2(d), after removing the threshold controlling implantation mask 12, boron ions ($B^+$) or the like are implanted for controlling the threshold value of the N-channel transistor of the logic region Rlogc by using a threshold controlling implantation mask 13 for covering the entire memory region Rmemo and the P-channel transistor formation region of the logic region Rlogc with the remaining gate insulating film 8 used as an implant protection film.

Figure 3A:
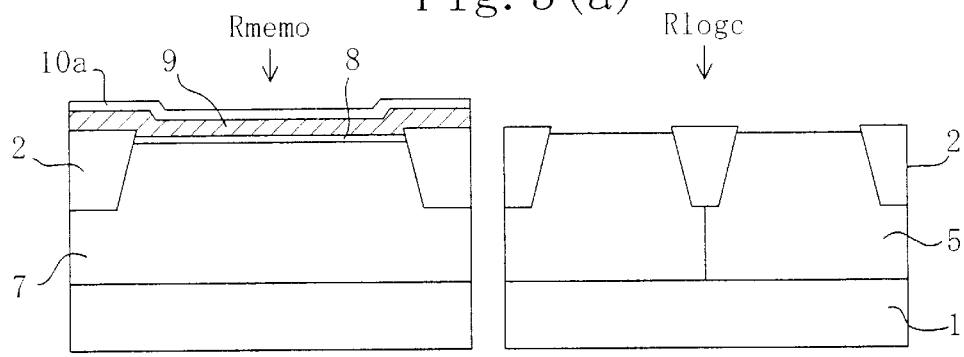
FIGS. 3(a), 3(b), 3(c) and 3(d) are cross-sectional views for showing procedures up to formation of a second implant protection film in the method of fabricating a semiconductor device of Embodiment 1.

Subsequently, in the procedure shown in FIG. 3(a), after removing the threshold controlling implantation mask 13, the gate insulating film 8 remaining in the logic region Rlogc is removed by the wet etching using buffered hydrofluoric acid.

Figure 3B:
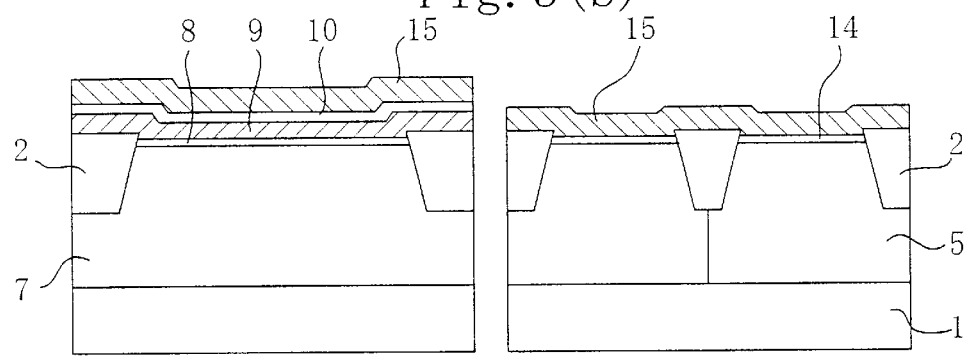

Next, in the procedure shown in FIG. 3(b), a gate insulating film 14 of a silicon oxide film of the logic device is formed by the thermal oxidation. At this point, the surface of the ON film 10a in the memory region Rmemo is also oxidized so as to be formed into an ONO film 10. Thereafter, a second polysilicon film 15 including phosphorus is formed by the CVD. The second polysilicon film 15 is to be formed into a control gate electrode of the nonvolatile memory device and a gate electrode of the logic device and has a thickness of approximately 200 nm.

Figure 3C:
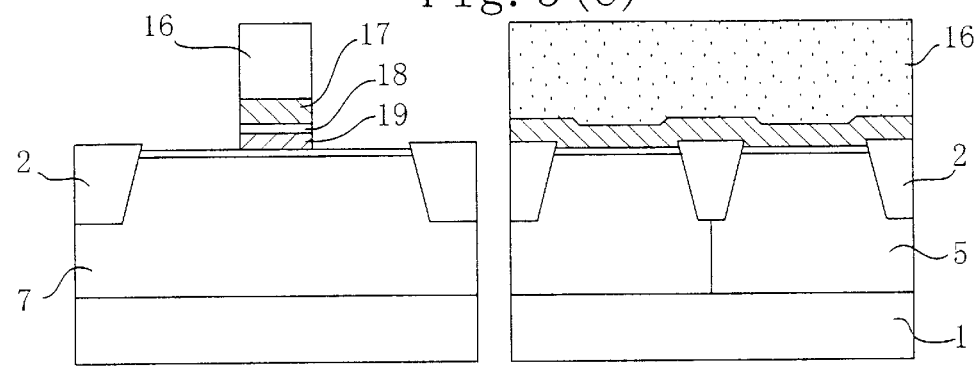

Then, in the procedure shown in FIG. 3(c), the second polysilicon film 15, the ONO film 10 and the first polysilicon film 9 in the memory region Rmemo are successively patterned by the dry etching using a stacked gate formation mask 16 for covering the entire logic region Rlogc and a gate formation region of the memory region Rmemo, thereby forming a stacked gate of the nonvolatile memory device including a control gate electrode 17, an interelectrode insulating film 18 and a floating gate electrode 19.

The procedures described so far are substantially the same as the procedures of the conventional method shown in FIGS. 12(a) through 12(d), 13(a) through 13(d) and 14(a) through 14(c).

Figure 3D:
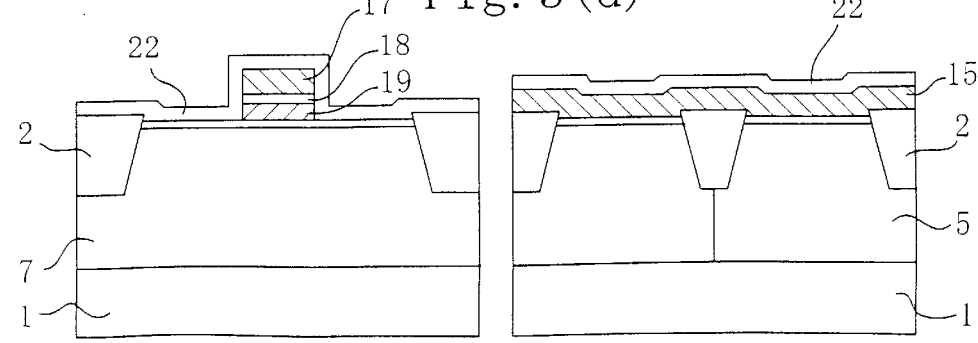

In this embodiment, in the procedure shown in FIG. 3(d), after removing the stacked gate formation mask 16, a gate electrode of the logic device is not formed but with allowing the second polysilicon film 15 to remain in the logic region Rlogc, the surfaces of the silicon films (including monosilicon and polysilicon films) exposed on the silicon substrate 1 are oxidized by the thermal oxidation, thereby forming a second implant protection film 22 of a silicon oxide film on the silicon substrate 1 in the memory region Rmemo, the stacked gate of the nonvolatile memory device and the second polysilicon film 15 remaining in the logic region Rlogc. The second implant protection film 22 is to be used as a protection film in ion implantation for forming a source/drain diffusion layer of the nonvolatile memory device.

Subsequently, in the procedure shown in FIG. 4(a), a source/drain diffusion layer 24 of the nonvolatile memory device is formed by implanting, for example, arsenic ions ($As^+$) and phosphorus ions ($P^+$) by using a source/drain formation mask 23 for the nonvolatile memory device for covering the entire logic region Rlogc. In this ion implantation, the arsenic ions are implanted at an ion acceleration voltage of approximately 40 keV and a dose of $2\times10^{15}$ $cm^{-2}$, and the phosphorus ions are implanted at an ion acceleration voltage of approximately 70 keV and a dose of $3\times10^{15}$ $cm^{-2}$.

Next, in the procedure shown in FIG. 4(b), after removing the source/drain formation mask 23, a heat treatment also serving as annealing is conducted in an atmosphere of oxygen at 850° C. for approximately 45 minutes in order to oxidize again the gate insulating film 8 of the nonvolatile memory device damaged by the ion implantation for recovering the insulating property thereof. Thereafter, the second implant protection film 22 formed on the second polysilicon film 15 at least in the logic region Rlogc is removed by anisotropic etching. At this point, since the second implant protection film 22 is removed by anisotropic dry etching, part of the second implant protection film 22 remains as sidewalls on the side faces of the stacked gate of the nonvolatile memory device.

Then, in the procedure shown in FIG. 4(c), the second polysilicon film 15 of polysilicon remaining in the logic region Rlogc is patterned by the dry etching using a gate electrode formation mask 20 for covering the entire memory region Rmemo and gate electrode formation regions of the P-channel and N-channel transistors of the logic region Rlogc, thereby forming a gate electrode 21 of the logic device.

Next, in the procedure shown in FIG. 4(d), after removing the gate electrode formation mask 20, an LDD diffusion layer 26 of the N-channel transistor is formed in the logic region Rlogc by implanting, for example, phosphorus ions ($P^+$) by using an LDD implantation mask 25 for covering the entire memory region Rmemo and the P-channel transistor formation region of the logic region Rlogc. This ion implantation is carried out in four steps at an ion acceleration voltage of approximately 30 keV, a dose of approximately $1\times10^{13}$ cm$^{-2}$ and an ion implantation angle inclined from the normal of the substrate by approximately 25 degrees. Furthermore, for suppressing the punch-through, boron ions ($B^+$) are implanted by using the LDD implantation mask 25 in four steps at an ion acceleration voltage of approximately 40 keV, a dose of approximately $3\times10^{12}$ cm$^{-2}$ and an ion implantation angle inclined by approximately 25 degrees.

Figure 5A:
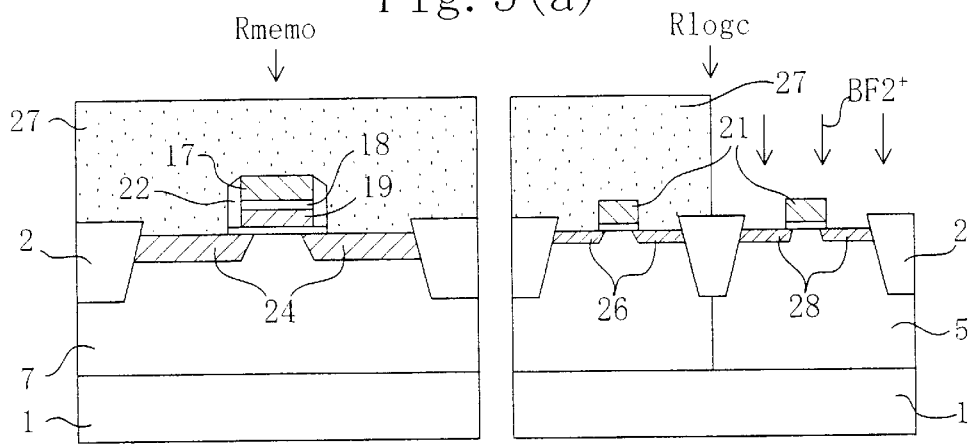
FIGS. 5(a), 5(b), 5(c) and 5(d) are cross-sectional views for showing procedures up to formation of source/drain diffusion layers of P-channel and N-channel transistors in the method of fabricating a semiconductor device of Embodiment 1.

Subsequently, in the procedure shown in FIG. 5(a), after removing the LDD implantation mask 25, boron fluoride ions ($BF_2^+$) are implanted by using an LDD implantation mask 27 for covering the entire memory region Rmemo and the N-channel transistor formation region of the logic region Rlogc, thereby forming an LDD diffusion layer 28 of the P-channel transistor in the logic region Rlogc. This ion implantation is carried out in four steps at an ion acceleration voltage of approximately 30 keV, a dose of approximately $1\times10^{13}$ cm$^{-2}$ and an ion implantation angle inclined from the normal of the substrate by approximately 7 degrees.

Figure 5B:
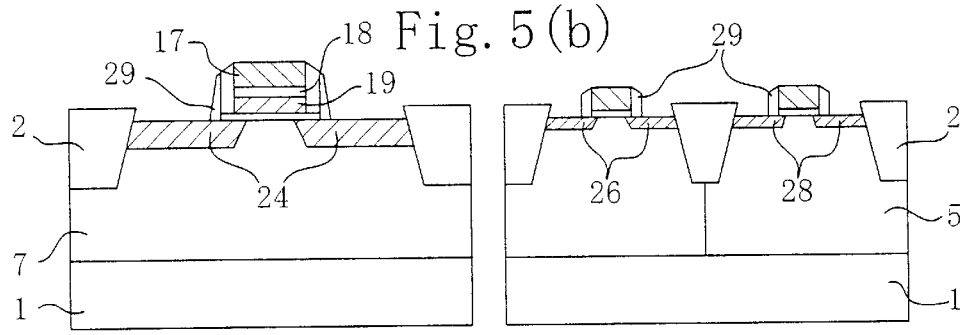

Next, in the procedure shown in FIG. 5(b), after removing the LDD implantation mask 27, a TEOS film is deposited by the CVD, and the TEOS film is formed by the anisotropic dry etching into sidewall spacers 29 on the side faces of the stacked gate of the nonvolatile memory device and the gate electrode 21 of the logic device.

Figure 5C:
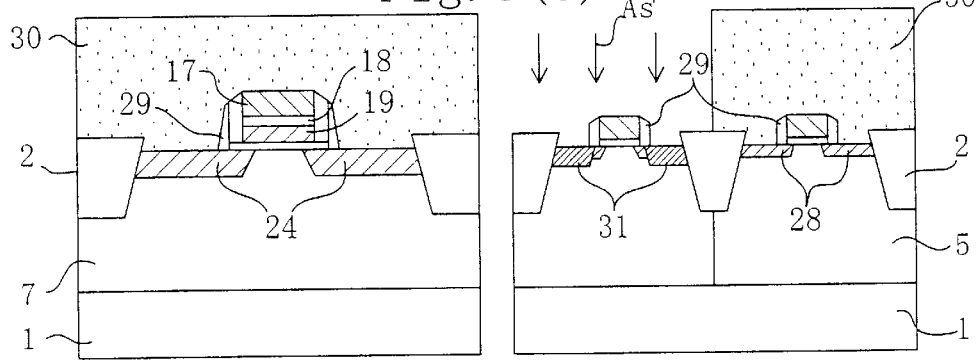

Then, in the procedure shown in FIG. 5(c), ions of arsenic or the like are implanted by using a source/drain implantation mask 3 of or covering the entire memory region Rmemo and the P-channel transistor formation region of the logic region Rlogc, thereby forming a source/drain diffusion layer 31 of the N-channel transistor in the logic region Rlogc. This ion implantation is carried out at an ion acceleration voltage of approximately 50 keV and a dose of approximately $2\times10^{15}$ cm$^{-2}$.

Figure 5D:
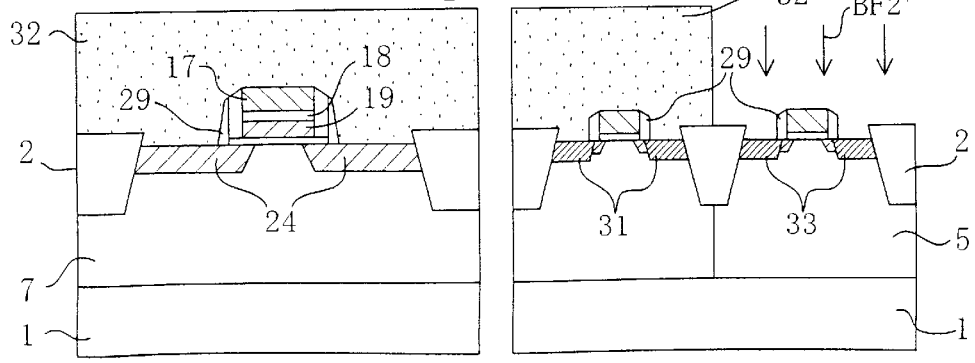

Next, in the procedure shown in FIG. 5(d), after removing the source/drain implantation mask 30, boron fluoride ions ($BF_2^+$) are implanted by using a source/drain implantation mask 32 for covering the entire memory region Rmemo and the N-channel transistor formation region of the logic region Rlogc, thereby forming a source/drain diffusion layer 33 of the P-channel transistor in the logic region Rlogc. This ion implantation is carried out at an ion acceleration voltage of approximately 30 keV and a dose of approximately $3\times10^{15}$ cm$^{-2}$.

Thereafter, although not shown in the drawings, for example, a titanium silicide layer is formed on the surfaces of the silicon substrate 1 and the gate electrode 21 in the logic region Rlogc by a silicide method, a CVD oxide film is formed as an interlayer insulating film, contact holes are formed so as to respectively reach the diffusion layers and the electrodes formed in the silicon substrate 1, and the contact holes are filled with plugs or lines. Thus, the semiconductor device of Embodiment 1 is completed.

The method of fabricating a semiconductor device of this embodiment can exhibit the following effects:

First, in the procedure shown in FIG. 4(a), the second polysilicon film 15 in the logic region Rlogc is not yet patterned in the ion implantation for forming the source/drain diffusion layer of the nonvolatile memory device carried out with allowing the second implant protection film 22 to remain on the substrate. Thereafter, in the procedure shown in FIG. 4(c), the second polysilicon film 15 is patterned into the gate electrode 21, and in the subsequent procedure shown in FIG. 4(d), the second implant protection film 22 in the logic region Rlogc has already been removed in conducting the impurity ion implantation for forming the LDD diffusion layer of the logic device. Accordingly, the energy for implanting the impurity ions for forming the LDD diffusion layer of the logic device can be reduced (for example, from the conventional energy of 50 keV to 30 keV). As a result, a shallow PN junction can be formed between the LDD diffusion layer 26 of the logic device and the well 5 or 7, and hence, the resultant structure is suitable to refinement of the logic device.

On the other hand, the ion implantation for forming the source/drain diffusion layer 24 of the nonvolatile memory device is carried out with the floating gate electrode 19 of the nonvolatile memory device covered with the second implant protection film 22 in the same manner as in the conventional fabrication method. Therefore, ions of the impurity such as arsenic and phosphorus can be suppressed from punching through the floating gate electrode 19 to the gate insulating film 8, resulting in suppressing the degradation of the insulating property of the gate insulating film 8.

Also, even the second implant protection film 22 cannot completely suppress the impurity ions from punching through the floating gate electrode 19 in some cases. Even in such a case, since the substrate is subjected to the heat treatment in an atmosphere of oxygen after the impurity ion implantation, the gate insulating film 8 that is degraded in the insulating property due to damage caused during the impurity ion implantation can be oxidized again so as to recover its insulating property. Accordingly, the gate insulating film of the resultant nonvolatile memory device can attain high reliability.

Furthermore, in the procedure shown in FIG. 4(b), the second implant protection film 22 is removed by the anisotropic dry etching. Therefore, the second implant protection film 22 on the second polysilicon film 15 in the logic region Rlogc can be removed with allowing part of the second implant protection film 22 to remain on the side faces of the stacked gate including the floating gate electrode of the nonvolatile memory device. Thereafter, in the procedure shown in FIG. 4(c), the floating gate 19 of the nonvolatile memory device is covered with the second implant protection film 22 in forming the gate electrode 21 of the logic device. Therefore, a fine logic device can be formed with high controllability without degrading the reliability of the nonvolatile memory device and without being affected by the thermal oxidation required for the reliability improvement of the nonvolatile memory device.

In this manner, high performance of the nonvolatile memory device and refinement of the logic device can be both realized.

Also, since no insulating film is present on the gate electrode 21 and the source/drain diffusion layers 31 and 33 after forming the source/drain diffusion layers 31 and 33 of the logic device, this method is suitable to formation of a silicide layer by the silicide method.

Embodiment 2

FIGS. 6(a) through 6(d), 7(a) through 7(d), 8(a) through 8(d), 9(a) through 9(d), 10(a) through 10(d), 11(a) and 11(b) are sectional views for showing procedures in a method of fabricating a semiconductor device according to Embodiment 2 of the invention. In each of these drawings, like reference numerals are used to refer to like elements used in Embodiment 1. In this embodiment, the second polysilicon film 15 including phosphorus formed in Embodiment 1 is replaced with a non-doped second polysilicon film 34.

Figure 6A:
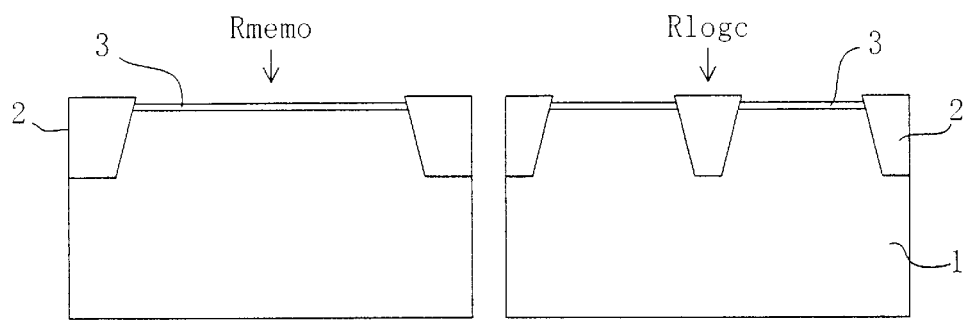
FIGS. 6(a), 6(b), 6(c) and 6(d) are cross-sectional views for showing procedures up to formation of a well in a method of fabricating a semiconductor device of Embodiment 2 of the invention.

First, in the procedure shown in FIG. 6(a), an isolation insulating film 2 of a silicon oxide film is formed in a memory region Rmemo and a logic region Rlogc on a silicon substrate 1 of P-type monosilicon, and a first implant protection film 3 of a silicon oxide film is formed in a region surrounded with the isolation insulating film 2 on the silicon substrate 1.

Figure 6B:
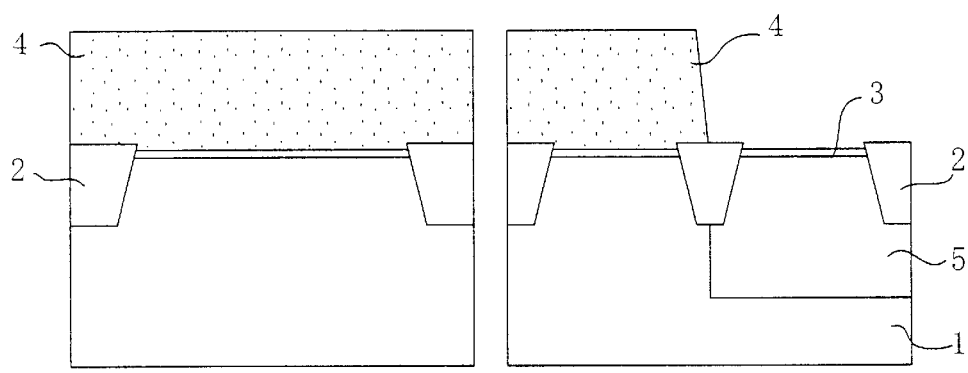

Next, in the procedure shown in FIG. 6(b), an N-type well 5 is formed by implanting ions of an N-type impurity (such as phosphorus) into a P-channel transistor formation region of the logic region Rlogc by using an N-type well formation mask 4 for covering the entire memory region Rmemo and an N-channel transistor formation region of the logic region Rlogc.

Figure 6C:
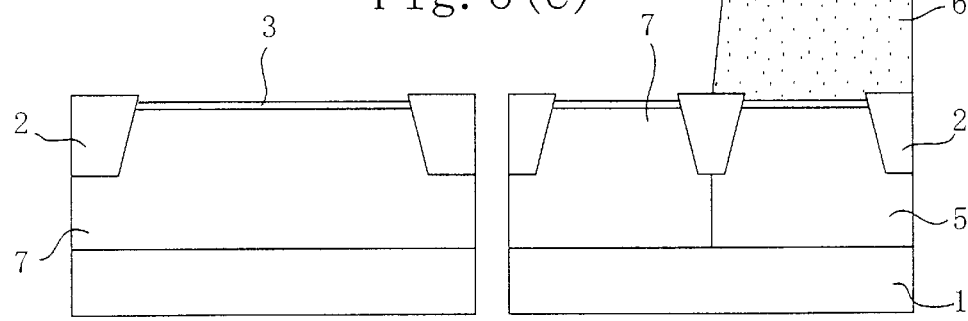

Then, in the procedure shown in FIG. 6(c), after removing the N-type well formation mask 4, a P-type well 7 is formed by implanting ions of a P-type impurity (such as boron) into the entire memory region Rmemo and the N-channel transistor formation region of the logic region Rlogc by using a P-type well formation mask 6 for covering the P-channel transistor formation region of the logic region Rlogc. At the same time, impurity ions are implanted into the silicon substrate 1 by using the P-type well formation mask 6 for controlling the threshold values of the nonvolatile memory device and the N-channel transistor.

Figure 6D:
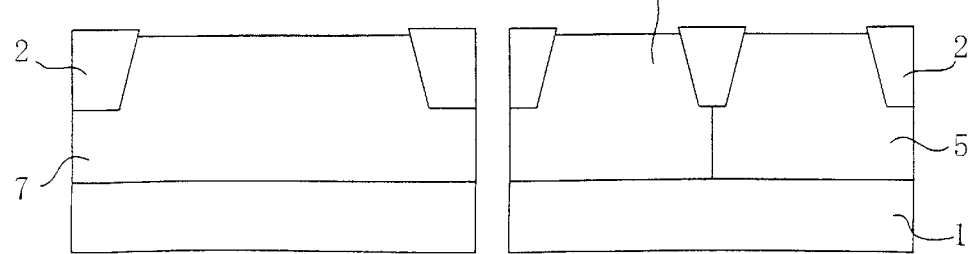

Next, in the procedure shown in FIG. 6(d), after removing the P-type well formation mask 6, the first implant protection film 3 in both the memory region Rmemo and the logic region Rlogc is removed by wet etching using buffered hydrofluoric acid.

Subsequently, in the procedure shown in FIG. 7(a), a gate insulating film 8 of a silicon oxide film is formed in the memory region Rmemo and the logic region Rlogc by the thermal oxidation, and a first polysilicon film 9 including phosphorus is then formed by the CVD. The first polysilicon film 9 is to be formed into a floating gate electrode of the nonvolatile memory device and has a thickness of approximately 200 nm. Thereafter, the first polysilicon film 9 is patterned by using a mask not shown so as to determine the dimension along the channel width of the nonvolatile memory device. Then, after removing the mask for patterning the first polysilicon film 9, an ON film 10a to be formed into an interelectrode insulating film of the nonvolatile memory device is then formed by the CVD.

Next, in the procedure shown in FIG. 7(b), the ON film 10a and the first polysilicon film 9 in the logic region Rlogc are successively removed by the dry etching using a mask 11 for covering the entire memory region Rmemo.

Then, in the procedure shown in FIG. 7(c), phosphorus ions ($P^+$) or the like are implanted for controlling the threshold value of the P-channel transistor of the logic region Rlogc by using a threshold controlling implantation mask 12 for covering the entire memory region Rmemo and the N-channel transistor formation region of the logic region Rlogc with the gate insulating film 8 remaining after the dry etching used as an implant protection film.

Next, in the procedure shown in FIG. 7(d), after removing the threshold controlling implantation mask 12, boron ions ($B^+$) or the like are implanted for controlling the threshold value of the N-channel transistor of the logic region Rlogc by using a threshold controlling implantation mask 13 for covering the entire memory region Rmemo and the P-channel transistor formation region of the logic region Rlogc with the remaining gate insulating film 8 used as an implant protection film.

Figure 8A:
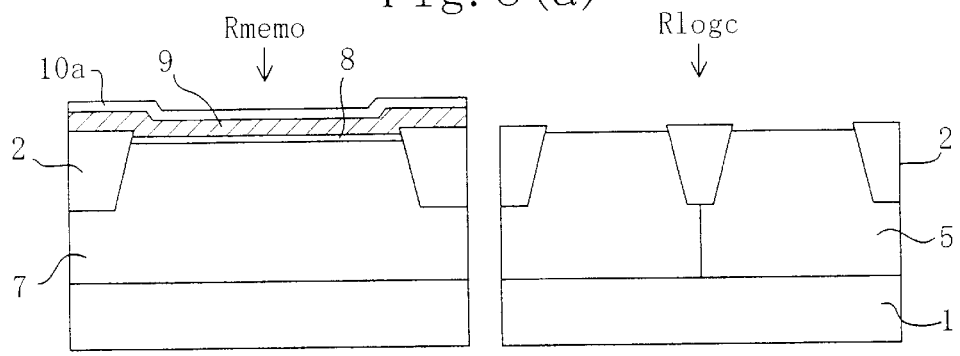
FIGS. 8(a), 8(b), 8(c) and 8(d) are cross-sectional views for showing procedures up to formation of a stacked gate of a nonvolatile memory device in the method of fabricating a semiconductor device of Embodiment 2.

Subsequently, in the procedure shown in FIG. 8(a), after removing the threshold controlling implantation mask 13, the gate insulating film 8 remaining in the logic region Rlogc is removed by the wet etching using buffered hydrofluoric acid.

Figure 8B:
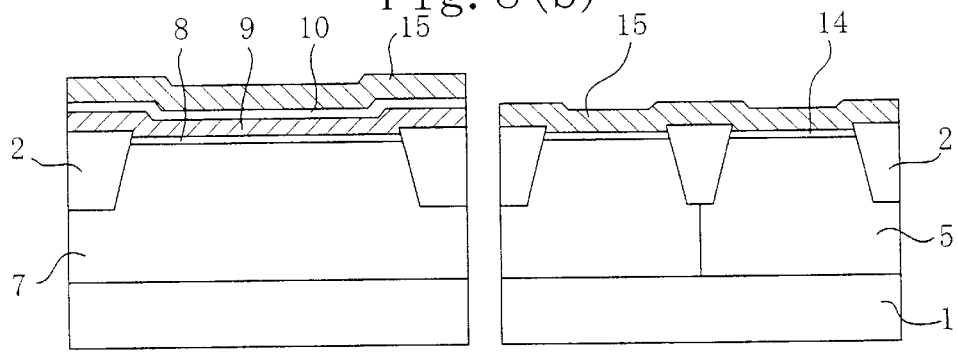

Next, in the procedure shown in FIG. 8(b), agate insulating film 14 of a silicon oxide film of the logic device is formed by the thermal oxidation. At this point, the surface of the ON film 10a in the memory region Rmemo is also oxidized so as to be formed into an ONO film 10. Thereafter, a non-doped second polysilicon film 34 is formed by the CVD. The second polysilicon film 34 is to be formed into a dual gate.

Figure 8C:
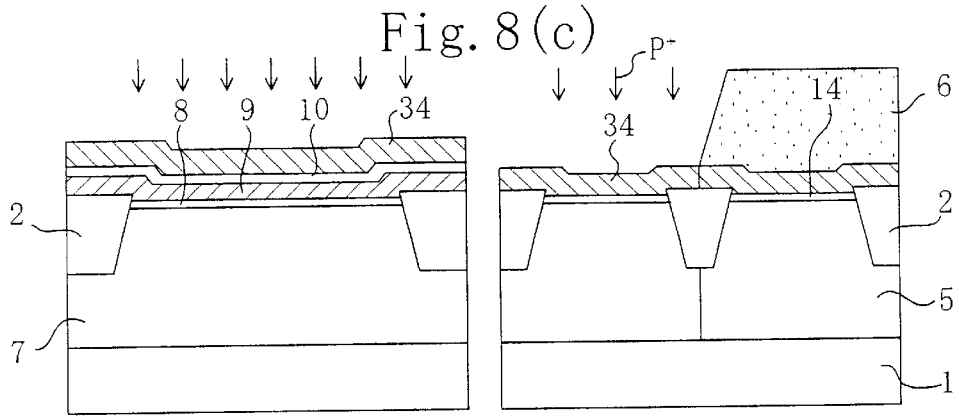

Then, in the procedure shown in FIG. 8(c), phosphorus ions ($P^+$) are implanted into portions of the second polysilicon film 34 disposed in the entire memory region Rmemo and the N-channel transistor formation region of the logic region Rlogc by using the P-type well formation mask 6 for covering the P-channel transistor formation region of the logic region Rlogc. Furthermore, the substrate is subjected to a heat treatment at approximately 800° C. for approximately 30 minutes, thereby activating the implanted impurity, namely, phosphorus. In this manner, the portions of the second polysilicon film 34 disposed in the memory region Rmemo and the N-channel transistor formation region of the logic region Rlogc are changed into an N-type polysilicon film.

Figure 8D:
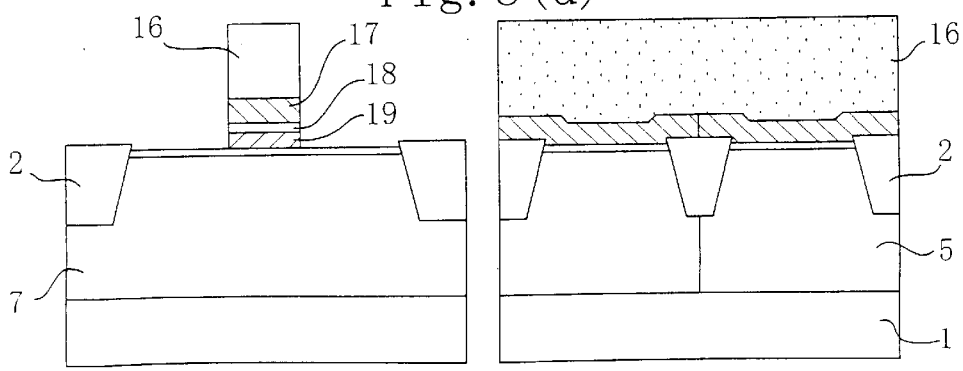

Next, in the procedure shown in FIG. 8(d), the second polysilicon film 34, the ONO film 10 and the first polysilicon film 9 in the memory region Rmemo are successively patterned by the dry etching using a stacked gate formation mask 16 for covering the entire logic region Rlogc and a gate formation region of the memory region Rmemo, so as to form a stacked gate of the nonvolatile memory device including a control gate electrode 17, an interelectrode insulating film 18 and a floating gate electrode 19.

Figure 9A:
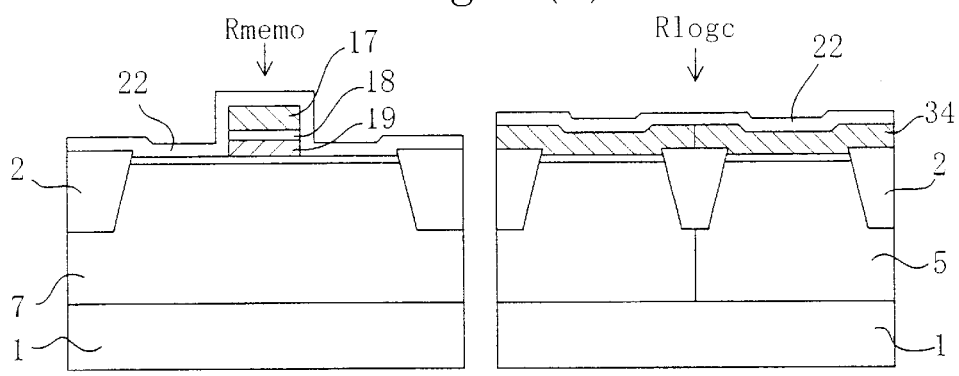
FIGS. 9(a), 9(b), 9(c) and 9(d) are cross-sectional views for showing procedures up to formation of a sidewall spacer in the method of fabricating a semiconductor device of Embodiment 2.

Subsequently, also in this embodiment, similarly to Embodiment 1, in the procedure shown in FIG. 9(a), after removing the stacked gate formation mask 16, a gate electrode of the logic device is not formed but with allowing the second polysilicon film 34 to remain in the logic region Rlogc, the surfaces of the silicon films (including monosilicon and polysilicon films) exposed on the silicon substrate 1 are oxidized by the thermal oxidation. Thus, a second implant protection film 22 of a silicon oxide film is formed on the silicon substrate 1 in the memory region Rmemo, the stacked gate of the nonvolatile memory device and the second polysilicon film 34 remaining in the logic region Rlogc. The second implant protection film 22 is to be formed in to an implant protection film used in forming a source/drain diffusion layer of the nonvolatile memory device.

Figure 9B:
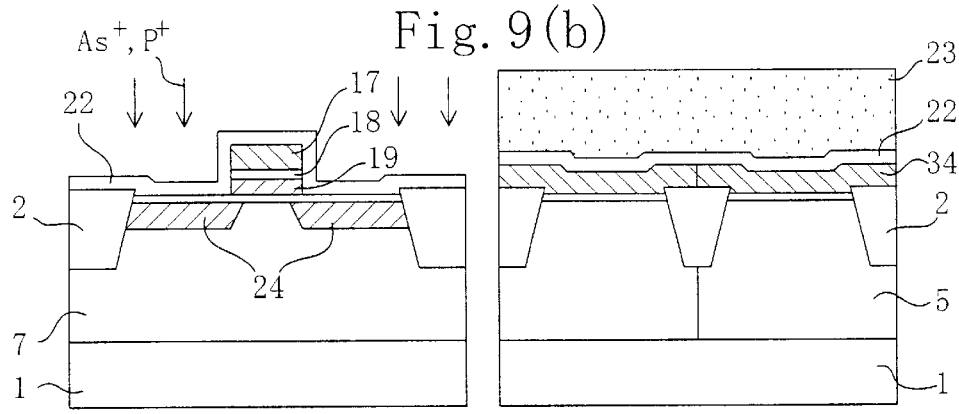

Next, in the procedure shown in FIG. 9(b), a source/drain diffusion layer 24 of the nonvolatile memory device is formed by implanting, for example, arsenic ions ($As^+$) and phosphorus ions ($P^+$) by using a source/drain formation mask 23 for the nonvolatile memory device for covering the entire logic region Rlogc. In this ion implantation, the arsenic ions are implanted at an ion acceleration voltage of approximately 40 keV and a dose of $2\times10^{15}$ cm$^{-2}$, and the phosphorus ions are implanted at an ion acceleration voltage of approximately 70 keV and a dose of $3\times10^{15}$ cm$^{-2}$.

Figure 9C:
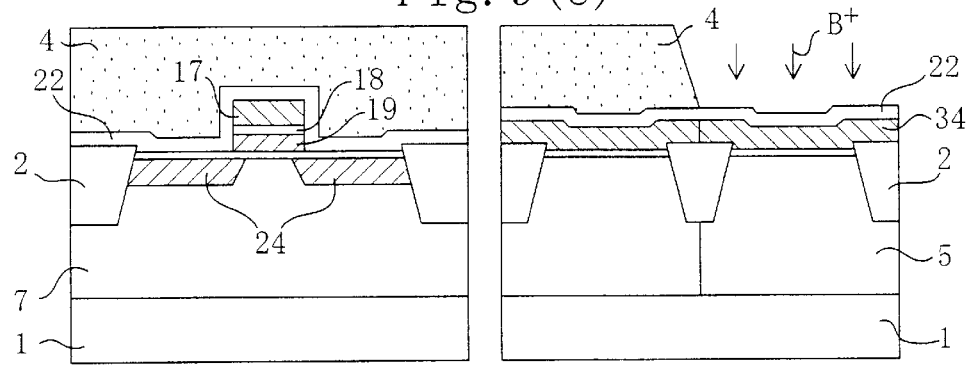

Then, in the procedure shown in FIG. 9(c), after removing the source/drain formation mask 23, a heat treatment also serving as annealing is carried out in an atmosphere of oxygen at approximately 850° C. for approximately 45 minutes in order to oxidize again the gate insulating film 8 damaged by the ion implantation for recovering the insulating property thereof. Thereafter, boron ions ($B^+$) are implanted through the second implant protection film 22 into a portion of the second polysilicon film 34 disposed in the P-channel transistor formation region of the logic region Rlogc by using the N-type well formation mask 4, so as to change the portion of the second polysilicon film 34 disposed in the P-channel transistor formation region of the logic region Rlogc into a p-type polysilicon film for preparation for the formation of the dual gate.

Figure 9D:
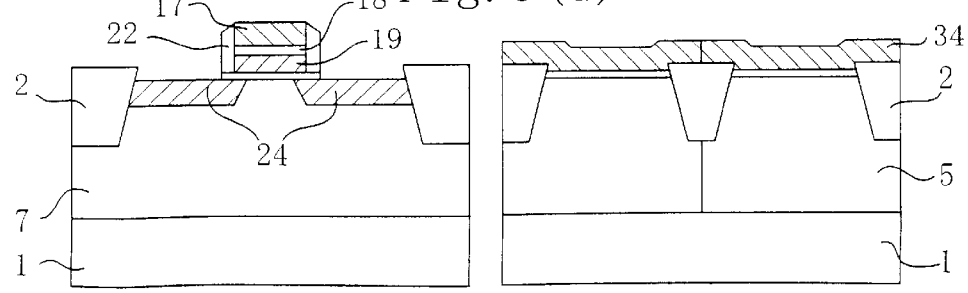

Next, in the procedure shown in FIG. 9(d), a portion of the second implant protection film 22 disposed on the second polysilicon film 34 in the logic region Rlogc is removed by the anisotropic etching. At this point, since the second implant protection film 22 is removed by the anisotropic etching, part of the second implant protection film 22 remains on the side faces of the stacked gate of the nonvolatile memory device as sidewalls.

Figure 10A:
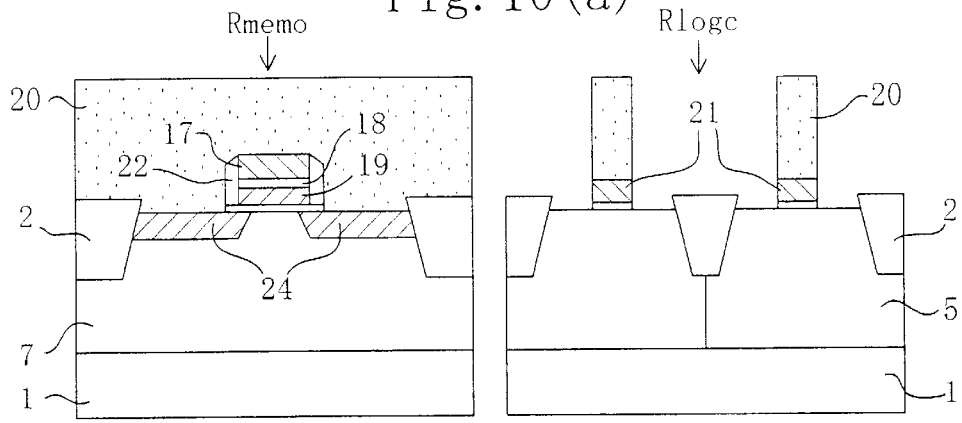
FIGS. 10(a), 10(b), 10(c) and 10(d) are cross-sectional views for showing procedures up to removal of a second implant protection film in the method of fabricating a semiconductor device of Embodiment 1.

Subsequently, in the procedure shown in FIG. 10(a), the second polysilicon film 34 of polysilicon in the logic region Rlogc is patterned by the dry etching using a gate electrode formation mask 20 for covering the entire memory region Rmemo and gate electrode formation regions of the P-channel and N-channel transistors in the logic region Rlogc, thereby forming a gate electrode 21 of the logic device.

Figure 10B:
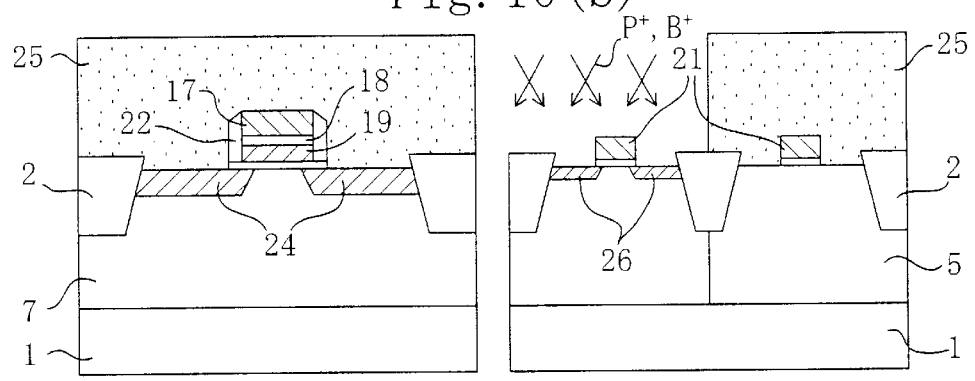

Next, in the procedure shown in FIG. 10(b), after removing the gate electrode formation mask 20, an LDD diffusion layer 26 of the N-channel transistor is formed in the logic region Rlogc by implanting, for example, phosphorus ions ($P^+$) by using an LDD implantation mask 25 for covering the entire memory region Rmemo and the P-channel transistor formation region of the logic region Rlogc. This ion implantation is carried out in four steps at an ion acceleration voltage of approximately 30 keV, a dose of approximately $1\times10^{13}$ cm$^{-2}$ and an ion implantation angle inclined from the normal of the substrate by approximately 25 degrees. Furthermore, for suppressing the punch-through, boron ions ($B^+$) are implanted by using the LDD implantation mask 25 at an ion acceleration voltage of approximately 40 keV, a dose of $3\times10^{12}$ cm$^{-2}$ and an ion implantation angle inclined by approximately 25 degrees.

Figure 10C:
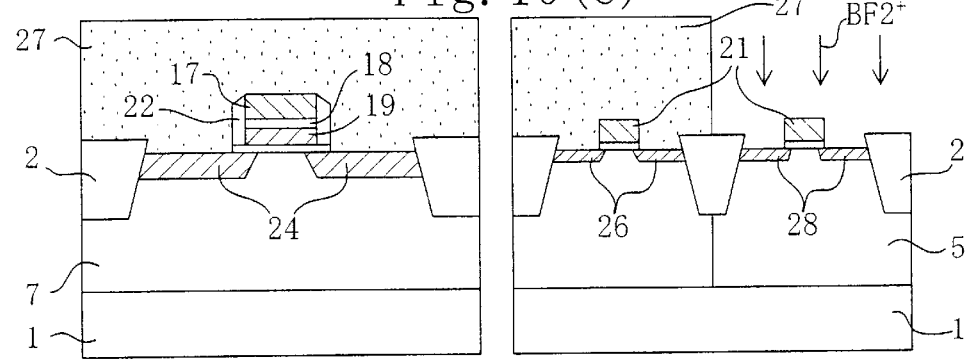

Then, in the procedure shown in FIG. 10(c), after removing the LDD implantation mask 25, boron fluoride ions ($BF_2^+$) are implanted by using an LDD implantation mask 27 for covering the entire memory region Rmemo and the N-channel transistor formation region of the logic region Rlogc, thereby forming an LDD diffusion layer 28 of the P-channel transistor in the logic region Rlogc. This ion implantation is carried out in four steps at an ion acceleration voltage of approximately 30 keV, a dose of approximately $1\times10^{13}$ cm$^{-2}$ and an ion implantation angle inclined from the normal of the substrate by approximately 7 degrees.

Figure 10D:
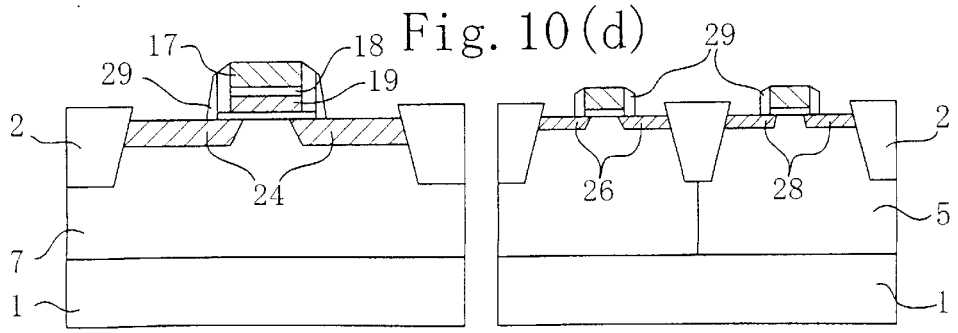

Next, in the procedure shown in FIG. 10(d), after removing the LDD implantation mask 27, a TEOS film is deposited, and the TEOS film is formed by the anisotropic dry etching into sidewall spacers 29 on the side faces of the stacked gate of the nonvolatile memory device and the gate electrode 21 of the logic device.

Figure 11A:
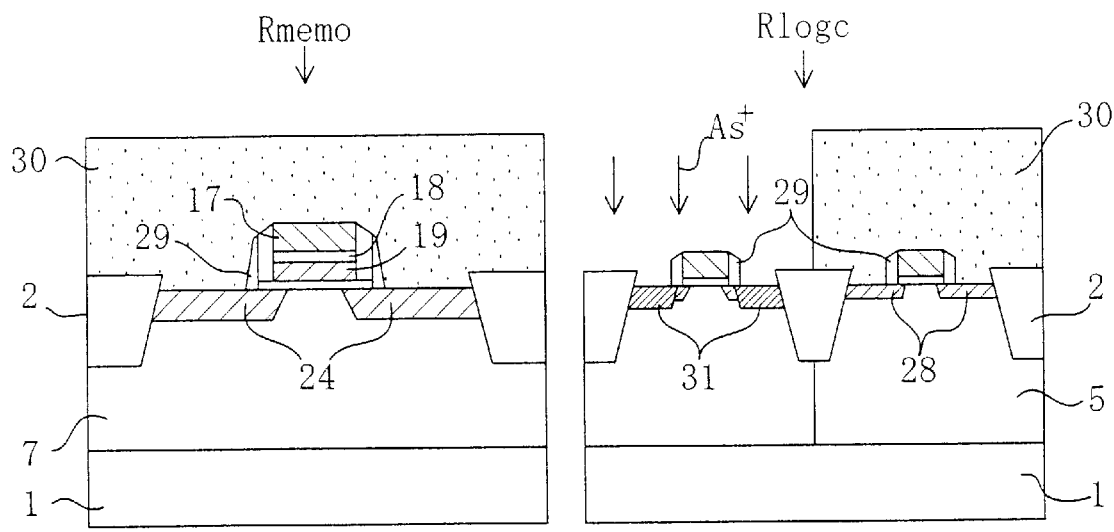
FIGS. 11(a) and 11(b) are cross-sectional views for showing procedures up to formation of source/drain diffusion layers of P-channel and N-channel transistors in the method of fabricating a semiconductor device of Embodiment 2.

Subsequently, in the procedure shown in FIG. 11(a), ions of arsenic or the like are implanted by using a source/drain implantation mask 30 for covering the entire memory region Rmemo and the P-channel transistor formation region of the logic region Rlogc, thereby forming a source/drain diffusion layer 31 of the N-channel transistor in the logic region Rlogc. This ion implantation is carried out at an ion acceleration voltage of approximately 50 keV and a dose of approximately $2\times10^{15}$ cm$^{-2}$.

Figure 11B:
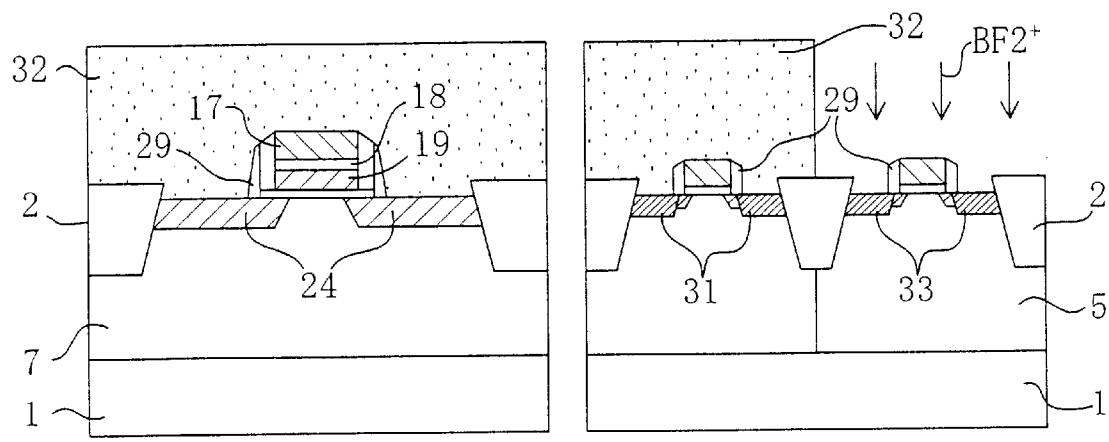
Figure 12A:
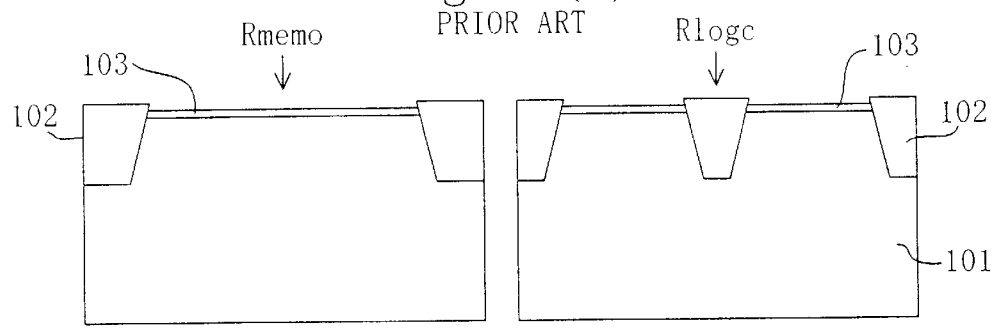
FIGS. 12(a), 12(b), 12(c) and 12(d) are cross-sectional views for showing procedures up to formation of a well in a conventional method of fabricating a semiconductor device.
Figure 12B:
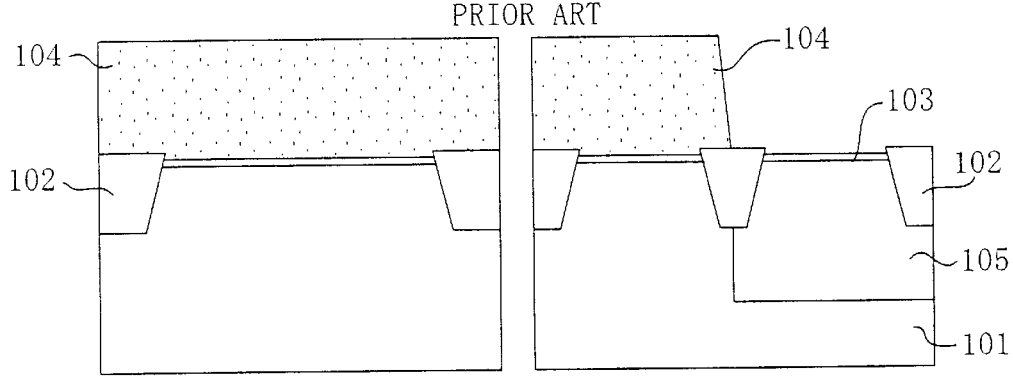
Figure 12C:
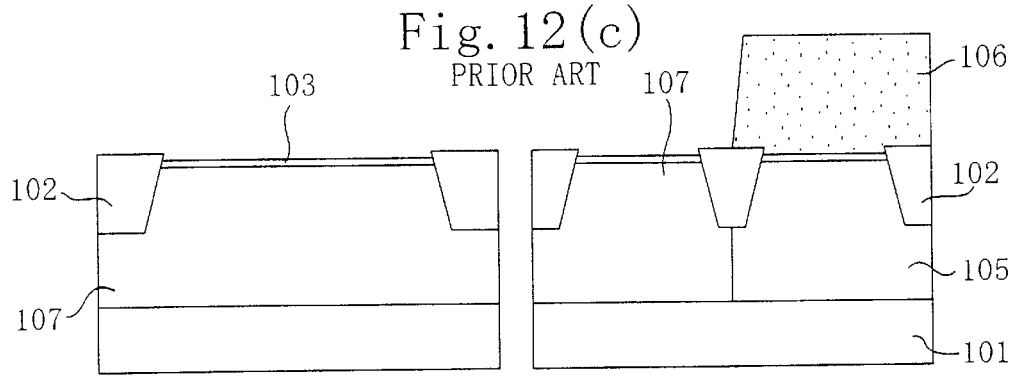
Figure 12D:
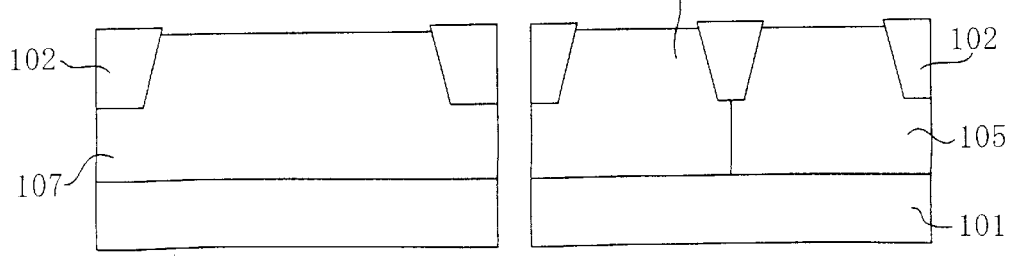
Figure 13A:
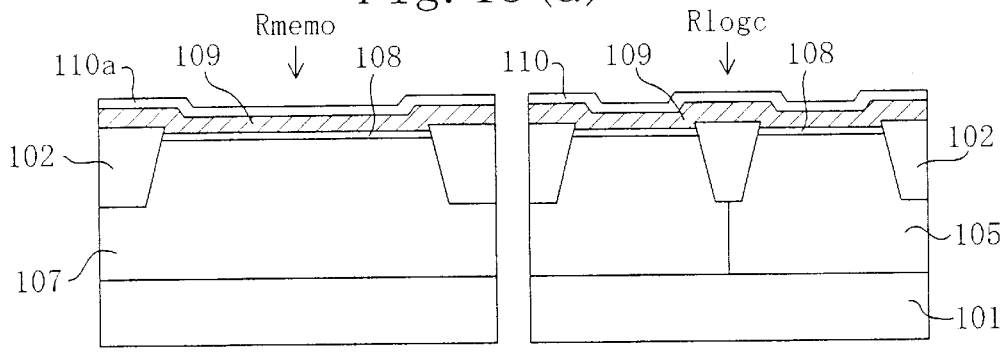
FIGS. 13(a), 13(b), 13(c) and 13(d) are cross-sectional views for showing procedures up to ion implantation for controlling the threshold value of each transistor in a logic region in the conventional method of fabricating a semiconductor device.
Figure 13B:
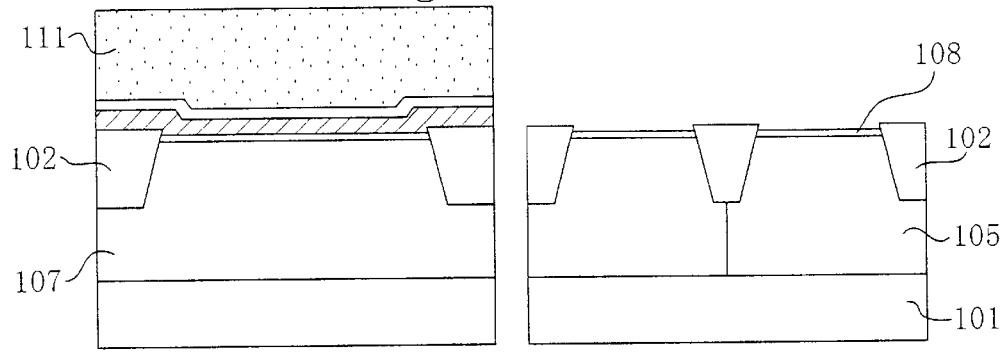
Figure 13C:
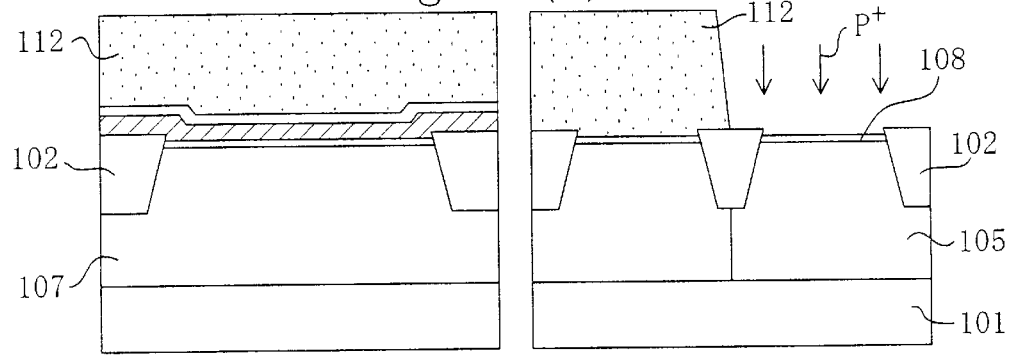
Figure 13D:
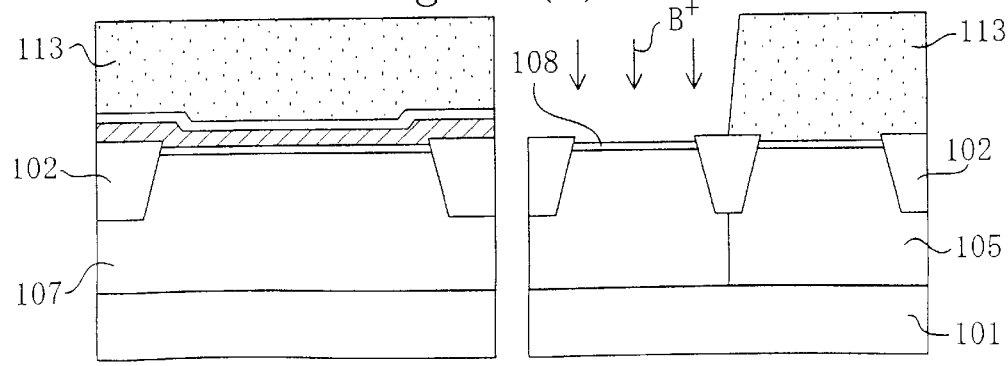
Figure 14A:
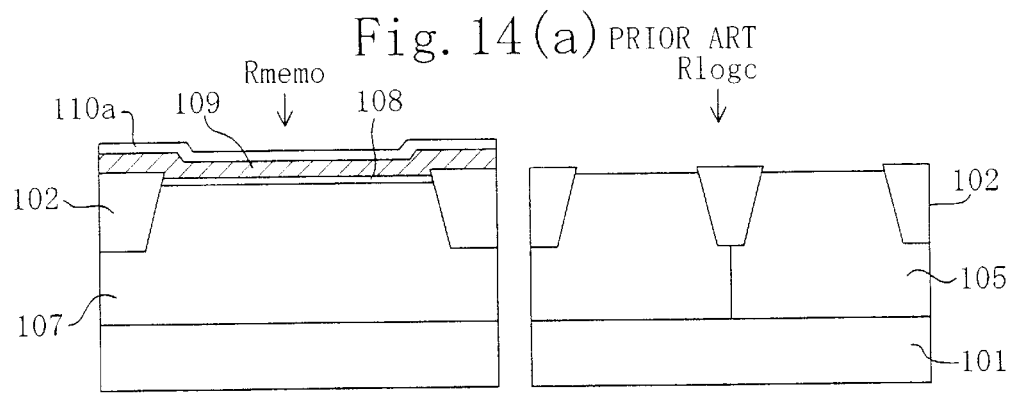
FIGS. 14(a), 14(b), 14(c) and 14(d) are cross-sectional views for showing procedures up to formation of a gate electrode of a logic device in the conventional method of fabricating a semiconductor device.
Figure 14B:
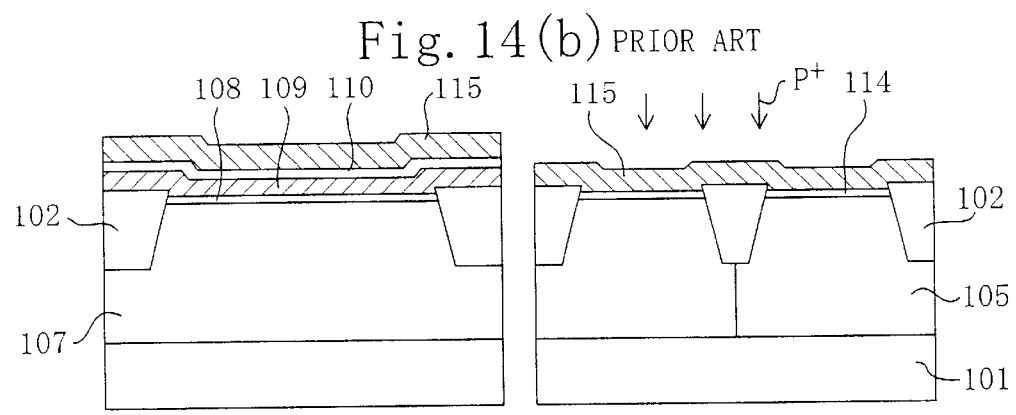
Figure 14C:
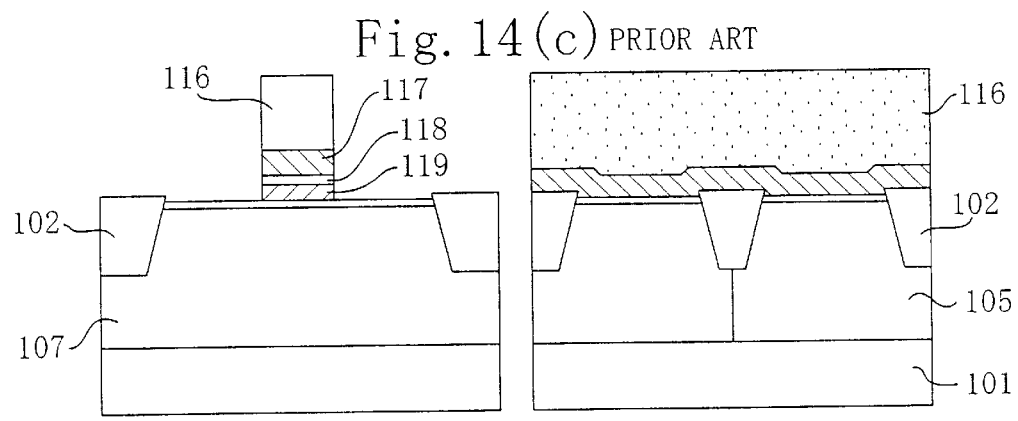
Figure 14D:
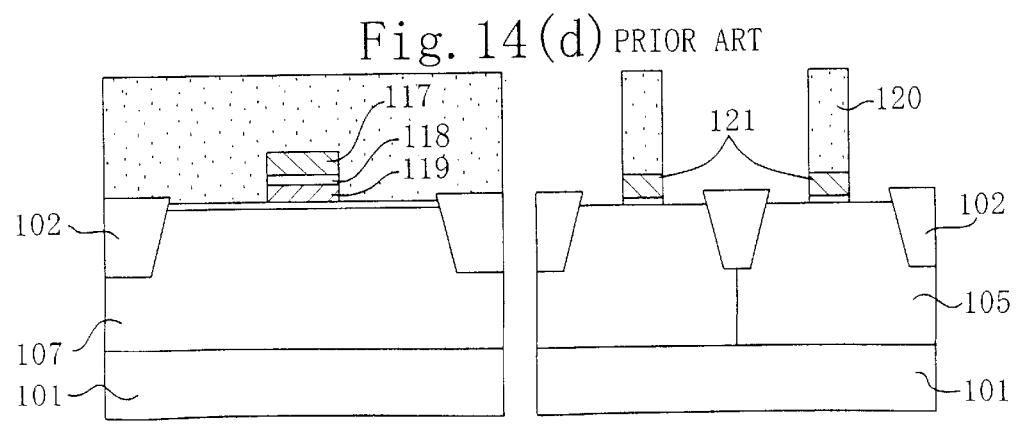
Figure 15A:
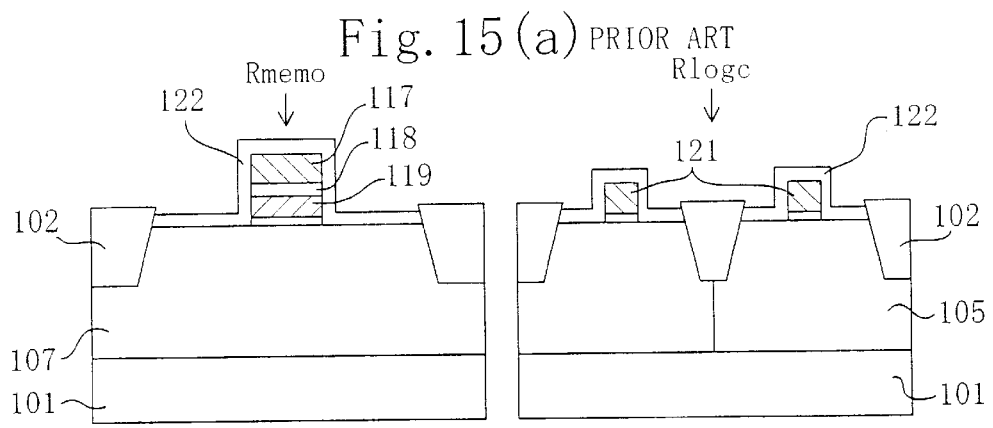
FIGS. 15(a), 15(b), 15(c) and 15(d) are cross-sectional views for showing procedures up to formation of an LDD diffusion layer of a P-channel transistor in the conventional method of fabricating a semiconductor device.
Figure 15B:
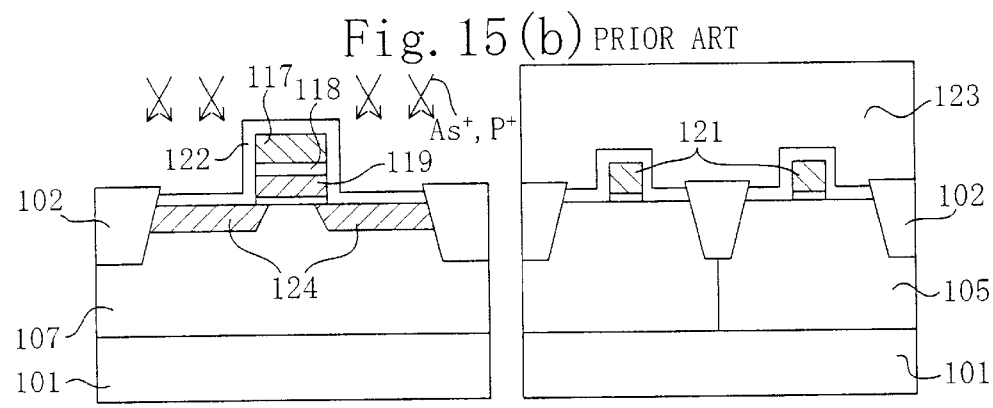
Figure 15C:
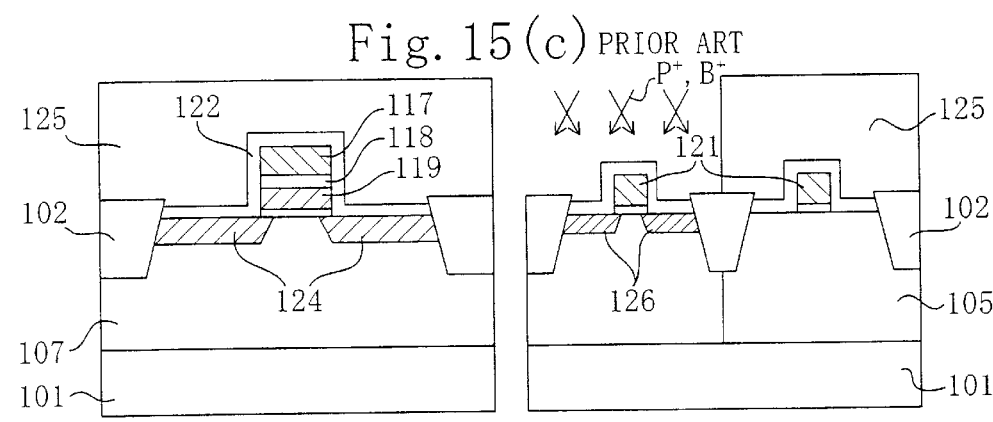
Figure 15D:
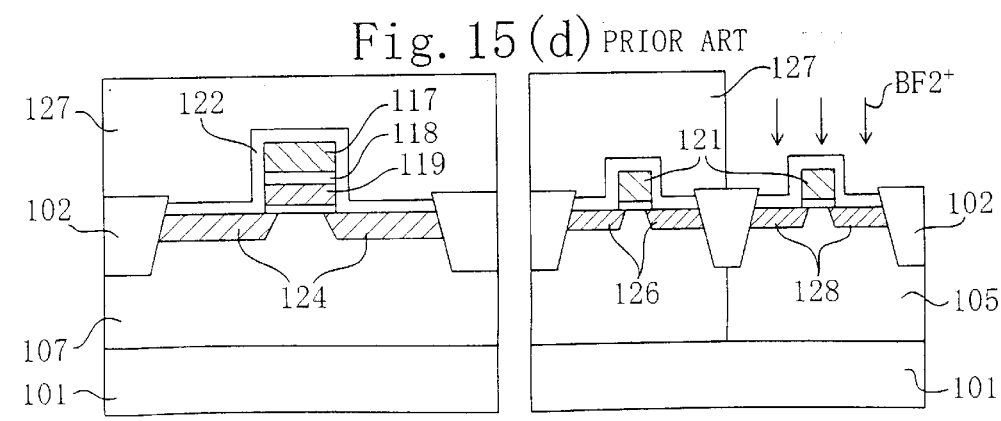
Figure 16A:
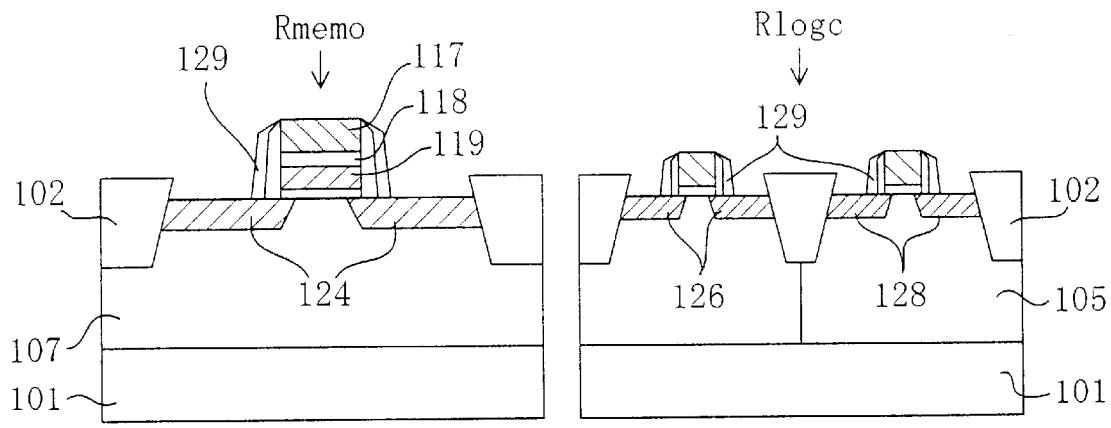
FIGS. 16(a), 16(b) and 16(c) are cross-sectional views for showing procedures up to formation of source/drain diffusion layers of P-channel and N-channel transistors in the conventional method of fabricating a semiconductor device.
Figure 16B:
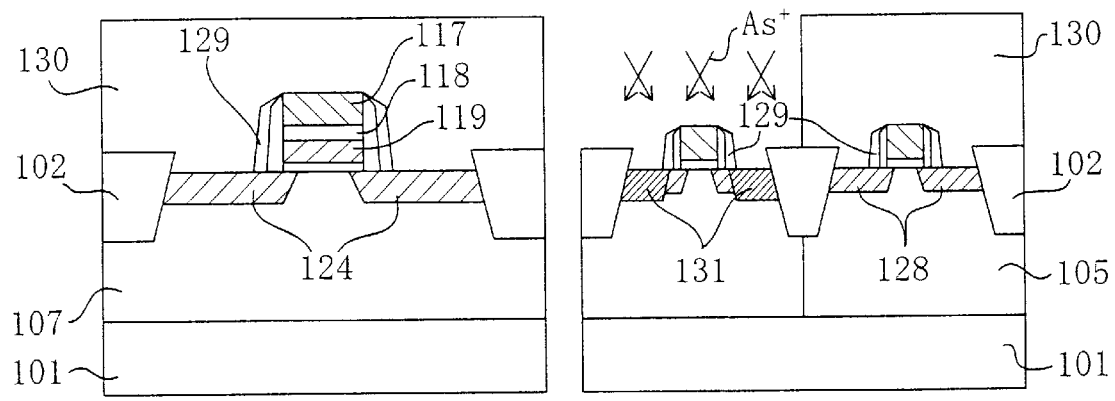
Figure 16C:
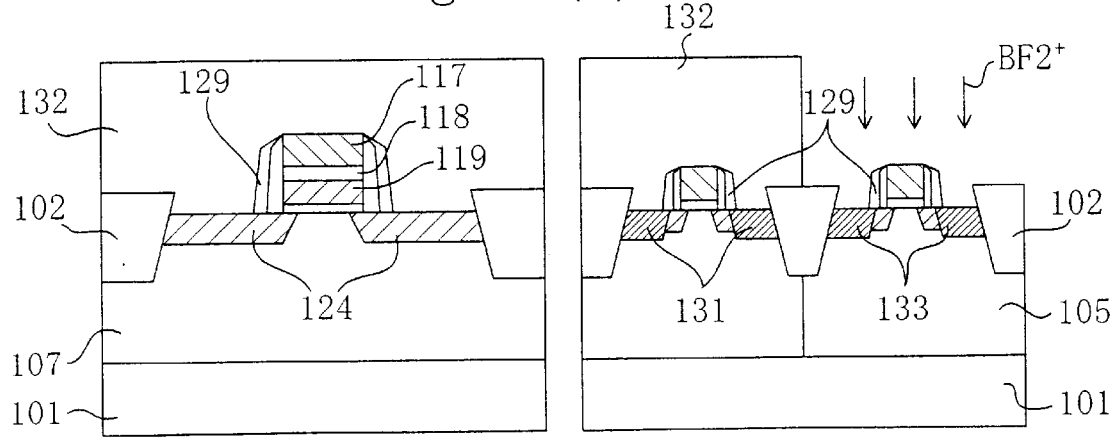

Next, in the procedure shown in FIG. 11(b), after removing the source/drain implantation mask 30, boron fluoride ions ($BF_2^+$) are implanted by using a source/drain implantation mask 32 for covering the entire memory region Rmemo and the N-channel transistor formation region of the logic region Rlogc, thereby forming a source/drain diffusion layer 33 of the P-channel transistor in the logic region Rlogc. This ion implantation is carried out at an ion acceleration voltage of approximately 30 keV and a dose of approximately $3\times10^{15}$ cm$^{-2}$.

Although procedures thereafter are not shown in the drawings, for example, a titanium silicide layer is formed on the surfaces of the silicon substrate 1 and the gate electrode 21 in the logic region Rlogc by a silicide method, a CVD oxide film is formed as an interlayer insulating film, contact holes are formed so as to respectively reach the diffusion layers and the electrodes formed in the silicon substrate 1, and the contact holes are filled with plugs or lines. Thus, the semiconductor device of Embodiment 2 is completed.

In the method of fabricating a semiconductor device of this embodiment, similarly to the method of Embodiment 1, the second implant protection film 22 in the logic region Rlogc is removed in implanting the impurity ions for forming the LDD diffusion layer of the logic device in the procedure shown in FIG. 10(d). Therefore, the energy for implanting the impurity ions for forming the LDD diffusion layer of the logic device can be reduced, and hence, a shallow PN junction can be formed between the LDD diffusion layer 26 of the logic device and the well 5 or 7. In this manner, high performance of the nonvolatile memory device and refinement of the logic device can be both realized.

In addition, the gate electrodes of the P-channel transistor and the N-channel transistor working as the logic device can be formed in the dual gate structure, and hence, the operation speed of the logic device can be improved.

Also, no insulating film is present on the gate electrode 21 and the source/drain diffusion layers 31 and 33 after forming the source/drain diffusion layers 31 and 33 of the logic device, and hence, this fabrication method is also suitable to formation of a silicide layer by the silicide method.

It is noted that the invention is applicable not only to a nonvolatile memory including a memory cell region and a peripheral circuit region, such as a PROM, an EEPROM and a flash memory, but also to a semiconductor device in general containing both of such a nonvolatile memory and a logic circuit like a processor.

What is claimed is:

1. A method of fabricating a semiconductor device including, on a semiconductor substrate, a memory region where a nonvolatile memory device is disposed and a logic region where a logic device is disposed, comprising the steps of:

(a) forming, in said memory region, a first insulating film to be formed into a gate insulating film of said nonvolatile memory device, a first conducting film and a second insulating film and forming, in said logic region, a gate insulating film of said logic device;

(b) forming a second conducting film on said semiconductor substrate after the step (a);

(c) forming a stacked gate of said nonvolatile memory device including a control gate electrode, an interelectrode insulating film and a floating gate electrode of said nonvolatile memory device by patterning said second conducting film, said second insulating film and said first conducting film in said memory region with allowing said second conducting film to remain in said logic region;

(d) forming, on said semiconductor substrate, a third insulating film for implant protection of said stacked gate after the step (c);

(e) implanting impurity ions for forming source/drain diffusion layers of said nonvolatile memory device into regions on both sides of said floating gate electrode in said semiconductor substrate after the step (d);

(f) removing at least a portion of said third insulating film disposed on said second conducting film by subjecting said third insulating film to anisotropic etching after the step (e); and (g) forming a gate electrode of said logic device by patterning said second conducting film remaining in said logic region.

2. The method of fabricating a semiconductor device of claim 1, further comprising, between the step (e) and the step (f), a step of subjecting said semiconductor substrate to a heat treatment in an oxidizing atmosphere.

3. The method of fabricating a semiconductor device of claim 1, further comprising the steps of:

implanting impurity ions for forming an LDD diffusion layer of said logic device by using said gate electrode as a mask after the step (g);

forming sidewall spacers on side faces of said floating gate electrode, said interelectrode insulating film and said control gate electrode of said nonvolatile memory device and side faces of said gate electrode of said logic device after forming said LDD diffusion layer of said logic device; and implanting impurity ions for forming source/drain diffusion layers of said logic device into said logic region by using said gate electrode and said sidewall spacers used as a mask.

4. The method of fabricating a semiconductor device of claim 1, wherein said third insulating film for implant protection is a silicon oxide film formed by CVD.

5. A method of fabricating a semiconductor device including, on a semiconductor substrate, a memory region where a nonvolatile memory device is disposed and a logic region where a logic device is disposed, comprising the steps of:

(a) forming, in said memory region, a first insulating film to be formed into a gate insulating film of said nonvolatile memory device, a conducting film and a second insulating film and forming, in said logic region, a gate insulating film of said logic device;

(b) forming a polysilicon film on said semiconductor substrate after the step (a);

(c) implanting N-type impurity ions into portions of said polysilicon film disposed in said memory region and an N-channel logic element formation region of said logic region;

(d) forming a stacked gate of said nonvolatile memory device including a control gate electrode, an interelectrode insulating film and a floating gate electrode by patterning said polysilicon film, said second insulating film and said conducting film in said memory region with allowing said polysilicon film to remain in said logic region;

(e) forming, on said semiconductor substrate, a third insulating film for implant protection of said stacked gate after the step (d);

(f) implanting impurity ions for forming source/drain diffusion layer of said nonvolatile memory device into regions on both sides of said floating gate electrode in said semiconductor substrate after the step (e);

(g) removing at least a portion of said third insulating film disposed on said polysilicon film by subjecting said third insulating film to anisotropic etching after the step (f);

(h) implanting P-type impurity ions into a portion of said polysilicon film disposed in a P-channel logic element formation region of said logic region after the step (f) or before or after the step (g); and (i) forming a gate electrode of said logic device by patterning said polysilicon film remaining in said logic region.

6. The method of fabricating a semiconductor device of claim 5, further comprising, after the step (f) or before the step (h), a step of subjecting said semiconductor substrate to a heat treatment in an oxidizing atmosphere.

7. The method of fabricating a semiconductor device of claim 5, further comprising the steps of:

implanting impurity ions for individually forming LDD diffusion layers of a P-channel logic element and an N-channel logic element of said logic device by using said gate electrode as a mask after the step (i);

forming sidewall spacers on side faces of said floating gate electrode, said interelectrode insulating film and said control gate electrode of said nonvolatile memory device and side faces of said gate electrode of said logic device after forming said LDD diffusion layers; and implanting impurity ions for individually forming source/drain diffusion layers of said P-channel logic element and said N-channel logic element in said logic region by using said gate electrode and said sidewall spacers as a mask.

8. The method of fabricating a semiconductor device of claim 4, wherein said third insulating film for implant protection is a silicon oxide film formed by CVD.

* * * * *